United States Patent [19]
Oota

[11] Patent Number: 6,018,167
[45] Date of Patent: Jan. 25, 2000

[54] LIGHT-EMITTING DEVICE

[75] Inventor: Kiyohisa Oota, Nara, Japan

[73] Assignee: Sharp Kabushiki Kaisha, Osaka, Japan

[21] Appl. No.: 08/998,713

[22] Filed: Dec. 29, 1997

[30] Foreign Application Priority Data

Dec. 27, 1996 [JP] Japan .................................. 8-351374
Oct. 24, 1997 [JP] Japan .................................. 9-292958

[51] Int. Cl.[7] .................................................. H01L 33/00
[52] U.S. Cl. ............................................. 257/99; 257/79
[58] Field of Search ................................... 257/82, 94, 99, 257/90, 98, 95, 100

[56] References Cited

U.S. PATENT DOCUMENTS

| | | | |
|---|---|---|---|
| 3,886,581 | 5/1975 | Katsumura et al. | 335/17 |
| 4,136,351 | 1/1979 | Sugawara et al. | 357/19 |
| 4,143,385 | 3/1979 | Miyoshi et al. | 357/19 |
| 4,709,253 | 11/1987 | Walters | 357/68 |
| 5,265,792 | 11/1993 | Harrah et al. . | |
| 5,440,575 | 8/1995 | Chand et al. | 372/49 |
| 5,814,837 | 9/1998 | Okazaki | 257/91 |
| 5,861,636 | 1/1999 | Dutta et al. | 257/91 |

FOREIGN PATENT DOCUMENTS

| | | |
|---|---|---|
| 54-22186 | 2/1979 | Japan . |
| 56-44591 | 10/1981 | Japan . |
| 57-49284 | 3/1982 | Japan . |
| 6-177435 | 6/1994 | Japan . |
| 6-326365 | 11/1994 | Japan . |
| 7-283439 | 10/1995 | Japan . |
| 8-172219 | 7/1996 | Japan . |
| 9-51122 | 2/1997 | Japan . |

Primary Examiner—David B. Hardy
Assistant Examiner—Huy Bui
Attorney, Agent, or Firm—Nixon & Vanderhye P.C.

[57] ABSTRACT

An LED chip 41 is mounted in a horizontal state in such a manner that a PN junction surface 42 is in perpendicular to a unit substrate 45. A side surface of a crystal surface of the LED chip 41 is recessed in such a manner as to have a distance with respect to a surface of the unit substrate 45, or is wholly covered by an electrically insulating film 52 formed of an ultraviolet curable type resin, so that even when the LED chip is in contact with wiring patterns 46, 47 of the unit substrate 45, an electric trouble such as an electrical short is not generated. An electrical connection to the LED chip 41 is performed by connecting thick film electrodes 53, 54 provided on both sides in a perpendicular direction to a PN junction surface, and the wiring patterns 46, 47 on the unit substrate 45 to each other through electrically conductive pastes 56, 57. Since a multiplicity of horizontally mounted LED chips 41 can be mounted on the unit substrate 45 without necessity of positioning at a high accuracy, an image display unit performing a matrix display can be easily manufactured.

17 Claims, 16 Drawing Sheets

LIGHT-EMITTING DEVICE

BACKGROUND OF THE INVENTION

1. Field of the Invention

The present invention relates to a light emitting display element mounted on a wiring substrate in a state that a PN junction surface of a chip is perpendicular to a substrate, a method for connecting the same to the wiring substrate and a method for manufacturing the same.

2. Description of the Related Art

Although a light emitting display element such as a light emitting diode (hereinafter, refer to a "LED") is used as an individual element, it is sometimes used for the purpose that a plurality of elements are disposed in a matrix manner so as to form a dot matrix display unit. Such a use includes a display for means of transportation disposed within a train and a taxi, a letter display portion and a back light of a button for a portable telephone, a display for a control apparatus or a display for an amusement apparatus.

In a typical prior art relating to a method for mounting the LED chip on the dot matrix display unit, after die bonding one of electrodes of the LED chip having the electrodes formed on two surfaces parallel to a PN junction surface onto a wiring substrate of the dot matrix display unit so as to directly junction, the electric connection between the other of the electrodes on the chip surface and the wiring substrate is performed by a wire bonding. In this method for mounting the LED chip, since only one of the electrodes is mounted on the wiring substrate, the PN junction surface becomes in parallel to the wiring substrate and the other of the electrodes is apart from the surface of the wiring substrate, it is necessary to electrically connect by the wire bonding. A disadvantage of this mounting method is that since it is necessary to perform a wire bonding by using a gap between the LED chips, the distance between the chips can not be reduced, a distance of about at least 2 mm is required and a more precise display for the dot matrix display unit can not be performed.

In order to solve this disadvantage, as shown in FIGS. 20A, 20B and 20C, a method for perpendicularly mounting a PN junction surface 2 of an LED chip 1 on a wiring substrate by thin film electrodes 3, 4 has been developed. Here, in the present specification, the method for mounting the chip in such a manner that the PN junction surface is in parallel to the wiring substrate is called as a vertically mounting method, and the method for mounting the chip in such a manner that the PN junction surface 2 is perpendicular to the wiring substrate as shown in FIGS. 20A, 20B and 20C is called as a horizontally mounting method. In the LED chip 1, the thin film electrodes 3, 4 are provided on both ends thereof in the perpendicular direction to the PN junction surface 2, and is electrically connected to wiring patterns 6, 7 formed on the surface of a unit substrate 5 or wiring substrate. At a time of performing this connection, at first, the side surface of the LED chip 1 is fixed to the unit substrate 5 by an adhesive 8 and the thin film electrodes disposed on the both sides are electrically connected to the wiring patterns 6, 7, respectively.

FIG. 20A shows the case that an accuracy for mounting the LED chip 1 to the unit substrate 5 is good. However, as shown in FIG. 20B, in the case that the accuracy for mounting the LED chip 1 to the unit substrate 5 is bad, since a crystal surface 10 is exposed to the side surface of the LED chip 1 and the side edge of the PN junction surface 2 is in a naked state, there is a risk that the PN junction surface 2 is electrically shorted by the wiring pattern 6. FIG. 20C shows a state that the LED chip 1 is vertically disposed in such a manner as to arrange the thin film electrode 4 to a bottom surface. Since the PN junction surface 2 is so structured that a P layer is made thinner than an N layer, the PN junction surface 2 is disposed at a position closer to the other, for example, the thin film electrode 3 among the thin film electrodes 3, 4. The thickness of the thin film electrode 3 is about one-some tenth μm (some thousands angstroms) and is made of a gold (Au) electrode.

The prior art for mounting the LED chip on the wiring substrate in a horizontal state is disclosed in, for example, Japanese Examined Patent Publication JP-B2 56-44591 (1981), and Japanese Unexamined Patent Publications JP-A 54-22186 (1979), JP-A 57-49284 (1982), JP-A 6-177435 (1994), JP-A 6-326365 (1994), JP-A 7-283439 (1995), 8-172219 (1996) and JP-A 9-51122 (1997).

In JP-B2 56-44591 (1981), in a state that an electrically insulating adhesive is applied to an LED chip mounting position on a wiring substrate, one side surface of an LED chip and each part of both electrodes are fixed to each other by the electrically insulating adhesive. The other electrodes of the LED chip and a wiring pattern on the wiring substrate are connected to each other by an electrically conductive adhesive or a solder alloy. A PN junction portion of the LED chip is in a naked state.

In JP-A 54-22186 (1979), a solder is applied on a wiring substrate so as to form a solder layer. An electrode of the LED chip is made of a metal compatible with the solder while leaving a light permeability space. When an LED chip is heated with being mounted at a chip mounting position on the wiring substrate, the solder is melted so that the solder connects between the wiring substrate and the electrode of the LED chip. A PN junction portion of the LED chip is in a naked state.

In JP-A 57-49284 (1982), in a state that an electrically insulating adhesive is applied on an electrically insulating substrate between electrode connecting portions on a wiring substrate, after one side surface of an LED chip is bonded so as to be temporarily connected, the electrode of the LED chip and the wiring pattern on a wiring substrate are connected by a solder alloy. A PN junction portion of the LED chip is in a naked state.

In JP-A 6-177435 (1994), in a state that a window is opened on a tape attached on a wiring substrate so as to determine a mounting position of an LED chip, a heat melted type electrically conductive material is formed on electrodes in both sides of the LED chip, the electrically conductive material melts by heat, thereby electrically connecting the electrode of the LED chip and the wiring pattern on the wiring substrate. A PN junction portion of the LED chip is in a naked state.

In JP-A 6-326365 (1994), an electrically insulating coating is applied to a side surface of an LED chip including both electrodes. Although a PN junction surface is not in a naked state, the electrically insulating coating is also attached to the side end surface of the electrode, so that there is a risk that a trouble occurs in an electrical connection with respect to a wiring pattern. In JP-A 8-172219 (1996), a multi-color LED including a plurality of PN junction surfaces is electrically conducted to a wiring substrate by using an electrically conductive adhesive and a metal brazing material. In these prior arts, the side edge of the PN junction surface is in a naked state. Accordingly, when the PN junction surface is mounted on the wiring substrate in a deteriorated accuracy, there is a risk that the PN junction surface is electrically shorted by the wiring pattern as mentioned above.

FIGS. 21A and 21B show a method for mounting an LED chip and a shape of the same in JP-A 7-283439 (1995) and JP-A 9-51122 (1997). An LED chip 11, a cross section of which is shown in FIG. 21A and a perspective view of which is shown in FIG. 21B, has a recess portion in which a part of a side surface including a periphery of a PN junction surface is sunk with respect to the other crystal portion so as to form an electrically insulating film 12. Thick film electrodes 13, 14 are respectively formed in further both sides of a thin film electrode which is in parallel to the PN junction surface and are electrically conducted to wiring patterns 6, 7 formed on a unit substrate 5 by means of electrically conductive pastes 16, 17, respectively. The electrically conductive pastes 16, 17 have a thermosetting performance.

FIGS. 22A, 22B and 22C show a state that the LED chip 11 of the type shown in FIGS. 21A and 21B is mounted on the unit wiring substrate 5. FIG. 22A shows the case that the mounting accuracy of the LED chip 11 is good and FIG. 22B shows the case that the mounting accuracy of the LED chip 11 is bad. Even when the mounting accuracy is bad, since the electrically insulating film 12 is formed around the PN junction surface, the electric trouble such as an electrical short and a leak is hard to occur. FIG. 22C shows a state that a plurality of LED chips 11 are mounted on the unit substrate 5. The plurality of LED chips 11 are mounted on a lower mold 21 heated by a heater 20 in a state of being fixed to the unit substrate 5 by means of the electrically conductive pastes 16, 17, and each of the LED chips 11 is pressed by an upper mold 22 through a rubber layer 23 from the upper portion. Accordingly, the thick film electrodes 13, 14 of each of the LED chips 11 is in close contact with the wiring patterns 6, 7 on the unit substrate 5, so that the electrically conductive pastes 16, 17 attached on the wiring patterns 6, 7 are set. As a result of this, in a state that the electric connection between the thick film electrodes 13, 14 and the wiring patterns 6, 7 is maintained, the LED chip 11 is fixed on the unit substrate 5 by means of the electrically conductive pastes 16, 17.

FIG. 23 shows a process of manufacturing the LED chip 11 having a partial electrically insulating film 12 on the side surface thereof as shown in FIGS. 22A, 22B and 22C. Step s1 shows a state that a P layer 31 and an N layer 32 are formed on a substrate by diffusion or the like, a PN junction surface 2 is formed on the boundary between the P layer 31 and the N layer 32, and an electrode layer 33 and an electrode layer 4 are respectively formed on one and the other surfaces. The electrode layers 33, 4 are formed by a vapor deposition of metal such as gold (Au) or gold beryllium (AuBe). In step s2, the P electrode provided in the P layer 31 end is manufactured by a photo etching. In step s3, a resist layer 34 is formed on the electrode layer 33 wholly formed on the one surface of an wafer 30, after exposed in accordance with a glass mask, the resist layer is treated by a developer and a rinse, the photo etching of the P electrode is performed, and the electrode layer 33 is removed while respectively leaving the terminal electrode 3. In step s4, a resist layer 35 is again applied on the terminal electrode 3 so that the photo etching is performed so as to leave the periphery of the terminal electrode 3 in a protected state. In step s5, a half-dicing for cutting out a portion between the terminal electrodes 3 from the one surface of the wafer 30 is performed. An adhesion tape is attached to the other surface end of the wafer 30. Cutting of the blade from the one surface end is performed in such a manner as not to completely separate the whole body but to leave the leavings of the dicing, for example, 110 μm. Next, the adhesion sheet is removed from the other surface of the wafer 30, and etching is performed using a mixture of such as a sulfuric acid ($H_2SO_4$) and a hydrogen peroxide solution ($H_2O_2$).

Next, in step s6, the resist for protecting is removed. An OMR remover is used for removing the resist. Next, in step s7, a resin made by mixing an epoxy resin and an acrylic resin is applied so as to form a resin layer 37 in the cut portion formed by the dicing in step s5. In step s8, an Ag paste electrode 38 is formed on both surfaces of the wafer 30, and in step s9, full-dicing for separating into each of the LED chips 11 is performed. At a time of the full-dicing, the other surface of the wafer 30 is attached to the adhesion sheet and each of the LED chips 11 is completely separated.

In the LED chips 1 and 11 shown in FIGS. 20A, 20B, 20C, 21A and 21B, since the side surface is fully or partly exposed as the crystal surface 10, when the chip mounting position is shifted at a time of being mounted to the unit substrate 5, there is a risk that the portion exposing as the crystal surface 10 is in contact with the wiring patterns 6, 7 on the unit substrate 5. When such a contact is generated, no current flows through the "PN junction surface 2" useful for emitting light of the LED chips 1 and 11, so that a trouble such as the reduction of the chip brightness and no-lighting of the chip is generated. As shown in FIGS. 21A and 21B, even in the case of the LED chip 11 of the type in which the electrically insulating film 12 covers the periphery of the PN junction surface 2, when the shift amount of the chip mounting position exceeds over a certain limit, the exposed portion of the crystal surface 10 is in contact with the wiring patterns 6, 7 on the unit substrate 5, so that the brightness reduction of the chip and the non-lighting of the chip are generated in the same manner as the LED chip 1 shown in FIGS. 20A, 20B and 20C. Accordingly, taking the dispersion of the chip mounting accuracy, the structure is not deemed to be a complete chip structure.

SUMMARY OF THE INVENTION

An object of the present invention is to provide a light emitting display element mounted on a substrate so that a PN junction surface thereof is made perpendicular to the substrate, which prevent a risk that a crystal end surface of the light emitting display element is undesirably in contact with the other portions due to a shift of a mounting position, so that there is no possibility of causing a trouble such as a reduction of a light emitting brightness and a non-lighting is generated, and to provide a method for connecting the same to a wiring substrate and a method for manufacturing the same.

The invention provides a light emitting display element manufactured of an wafer semiconductor material, and mounted on a wiring substrate so that a PN junction surface is made perpendicular to the wiring substrate, the light emitting display element comprising terminal electrodes formed on both ends thereof in a perpendicular direction to the PN junction surface, the terminal electrodes being connected to connection electrodes provided on the wiring substrate at an interval, wherein a side surface of the light emitting display element between the terminal electrodes is opposed to the wiring substrate, and an electrically insulating coat is formed on the whole of at least the side surface.

In accordance with the invention, the terminal electrodes are respectively formed at both ends in the perpendicular direction to the PN junction surface of the light emitting display element mounted on the wiring substrate so that the PN junction surface is made perpendicular to the wiring substrate. The connection electrodes are provided on the wiring substrate at an interval and the terminal electrodes are electrically connected thereto, respectively. Since the one side surface between the terminal electrodes of the light emitting display element is opposed to the wiring substrate and the electrically insulating coat is formed on the whole of at least the side surface, even when the mounting accuracy of the light emitting display element on the wiring substrate is bad and the position shift becomes large, there is no risk that a side edge of the PN junction surface is in contact with the other portion such as pattern so that the trouble of the brightness reduction and the non-lighting can be prevented.

As mentioned above, in accordance with the invention, since the electrically insulating coat is formed on the side surface opposite to the wiring substrate at a time of mounting it to the wiring substrate among the side surfaces of the semiconductor display element, even when the mounting position is shifted, the crystal surface will not be contact with the wiring pattern or the like, so that the troubles such as the brightness reduction and the non-lighting caused by the electrical short in the PN junction surface can be prevented. Since the electrical connection can be well performed even when the accuracy of the mounting position at a time of mounting to the substrate is not so good, it is not necessary to improve the mounting accuracy of a die bonding apparatus for the light emitting display element chip, so that the chip can be mounted by an inexpensive apparatus and at a high speed. Further, it is unnecessary to perform a repair operation in which a new light emitting display element chip is again mounted after the chip of the light emitting display element is temporarily mounted and is removed, so that an image display unit which requires a multiplicity of light emitting display elements mounted can be manufactured with high productivity.

Further, in the invention it is preferable that the electrically insulating coat is formed of an ultraviolet curable resin.

In accordance with the invention, since the electrically insulating coat is formed of an ultraviolet curable resin, the electrically insulating coat can be efficiently formed by selectively irradiating ultraviolet rays. Since the ultraviolet curable resin is used, either a cured part or a non-cured part can be easily selected, and additionally since it is not necessary to heat, the electrically insulating coat can be easily formed.

In accordance with the invention, since the electrically insulating coat on the side surface of the light emitting display element is formed of the ultraviolet curable resin, the coat for covering the side surface of the light emitting display element can be easily formed.

Further, in the invention it is preferable that the electrically insulating coat is transparent to light outgoing from the PN junction surface and is made of a material selected from among organic materials including epoxy resins and phenol resins or inorganic materials including silicon oxides and aluminum oxides.

In accordance with the invention, since the electrically insulating coat covering the side edge of the PN junction surface is made transparent, the light generated at the PN junction surface can be outputted as it is.

In accordance with the invention, since the electrically insulating coat is made transparent, the light generated at the PN junction surface can be outputted as it is without changing the wave length and reducing the intensity.

Further, in the invention it is preferable that the semiconductor material is a material selected from among III–V group compound semiconductors, II–VI group compound semiconductors or a silicon carbide.

In accordance with the invention, the light emitting display element having a high light emitting efficiency can be obtained by using the semiconductor material selected from among the compound semiconductors generally emitting visible light.

In accordance with the invention, since the light emitting display element is formed of a semiconductor material selected from among the compound semiconductors generally emitting visible light, the light emitting display element having a high light emitting efficiency can be obtained.

Further, in the invention it is preferable that the terminal electrodes are formed of a combination of a metal thin film, and an electrically conductive brazing material or an electrically conductive resin adhesive.

In accordance with the invention, the electrically conductive brazing material or the electrically conductive resin adhesive can electrically conducts between the electrodes on the end surfaces of the P- and N-type semiconductor layers in the light emitting display element, and the metal thin films thereby achieving an electrical connection with respect to the external.

In accordance with the invention, the electrically conductive brazing material or the electrically conductive resin adhesive and the metal thin film can electrically connects between the electrodes on the end surfaces of the P- and N-type semiconductor layers in the light emitting display element, and the external.

Further, in the invention it is preferable that the terminal electrodes are formed of a combination of a metal thin film and an anisotropic electrically conductive resin adhesive.

In accordance with the invention, the anisotropic electrically conductive resin adhesive can cause continuity between the electrodes on the end surfaces of the P- and N-type semiconductor layers in the light emitting display element and the metal thin film, and the metal thin film can cause electrical connection with the external.

In accordance with the invention, the anisotropic electrically conductive resin adhesive and the metal thin film can electrically connect the electrodes on the end surfaces of the P- and N-type semiconductor layers in the light emitting display element with the external.

In the invention, it is preferable the terminal electrodes are so formed on the both ends in the perpendicular direction to the PN junction surface, of the light emitting display surface, that surfaces of the terminal electrodes are made perpendicular to the surface of the wiring substrate.

In accordance with the invention, since the side end surfaces of the terminal electrodes are in parallel to the surface of the electric substrate, the contact areas between the terminal electrodes and the connection electrodes on the wiring substrate can be made large. When n the side end surface of the terminal electrode is not in parallel to the connection electrode, the contact portion becomes a line so that the contact area becomes small. When the contact area is large, the conductivity can be easily obtained and the electric resistance can be reduced.

In accordance with the invention, the contact areas between the terminal electrodes of the light emitting display element and the connection electrodes on the wiring substrate can be made large, the conductivity can be easily obtained and the electric resistance can be reduced.

Further, in the invention it is preferable that the terminal electrodes are formed so as to leave light transmitting space on at least part of the respective ends of the light emitting display element.

In accordance with the invention, although the terminal electrodes do not transmit light, the terminal electrodes are formed in such a manner as to leave the light transmitting space on not the whole, but at least part of the respective ends of the light emitting display element. The light emitted from the semiconductor crystal can be taken out through the light transmitting space so that the light emitting intensity can be increased.

In accordance with the invention, since the terminal electrode is formed in such a manner as to leave the light transmitting space on at least part of the respective ends of the light emitting display element, the light emitted from the semiconductor crystal can be taken out so that the light emitting intensity can be increased.

Further, in the present invention it is preferable that a step is formed in the side surface opposite to the wiring substrate so that a side edge of the PN junction surface is recessed from side end surfaces of the terminal electrodes.

In accordance with the present invention, since the step is formed in the side surface of the light emitting display element opposite to the wiring substrate, the light emitting display element can be mounted on the wiring substrate so that a space is provided between the connection electrodes on the wiring substrate and the side edge of the PN junction surface. Accordingly, even when the mounting accuracy is bad, the electrical short between the PN junction surface and the connection electrode can be prevented.

In accordance with the present invention, even when the accuracy of mounting the light emitting display element on the wiring substrate is bad, the electrical short between the PN junction surface and the connection electrodes can be prevented by the step formed in the side surface of the light emitting display element.

Further, in the present invention it is preferable that the electrically insulating coat is formed on the side surface on which the step is formed, in such a manner that a surface of the electrically insulating coat is disposed on the same plane as the side end surfaces of the terminal electrodes formed at both the ends.

In accordance with the invention, when the light emitting display element is mounted on the wiring substrate, the surface of the electrically insulating coat and the side end surfaces of the terminal electrodes are disposed on the same plane, and at least the electrically insulating coat does not protrude from the side end surfaces of the terminal electrodes, so that the terminal electrodes can be securely contacted with the connection electrodes so as to be brought into continuity therewith.

In accordance with the invention, since the surface of the electrically insulating coat and the side end surfaces of the terminal electrodes are disposed on the same plane, continuity between the terminal electrode and the connection electrode can be secured.

Further, the invention provides a light emitting display element manufactured of an wafer semiconductor material, the light emitting display element being mounted on a wiring substrate so that a PN junction surface is made perpendicular to the wiring substrate, comprising terminal electrodes formed at both ends in a perpendicular direction to the PN junction surface, the terminal electrodes being connected to connection electrodes provided on the wiring substrate at an interval, wherein a step is formed in a side surface of the light emitting display element opposing to the wiring substrate so that a side edge of the PN junction surface is recessed from side end surfaces of the terminal electrodes.

In accordance with the present invention, since the step is formed in the side surface opposite to the wiring substrate of the light emitting display element, the light emitting display element can be mounted on the wiring substrate so that a space is provided between the connection electrodes on the wiring substrates and the side edge of the PN junction surface. Accordingly, even when the mounting accuracy is bad, the electrical short between the PN junction surface and the connection electrodes can be prevented.

In accordance with the present invention, even when the accuracy of mounting the light emitting display element on the wiring substrate is bad, the electrical short between the PN junction surface and the connection electrodes can be prevented by the step formed in the side surface of the light emitting display element.

Further, in the present invention it is preferable that an electrically insulating coat is formed on the side surface in which the step is formed, in such a manner that a surface of the electrically insulating coat is disposed on the same plane as the side end surfaces of the terminal electrodes formed at both the ends.

In accordance with the invention, when the light emitting display element is mounted on the wiring substrate, the surface of the electrically insulating coat and the side end surfaces of the terminal electrodes are disposed on the same plane, and at least the electrically insulating coat does not protrude from the side end surfaces of the terminal electrodes, so that the terminal electrodes can be securely contacted with the connection electrodes so as to have continuity therewith.

In accordance with the invention, since the surface of the electrically insulating coat and the side end surfaces of the terminal electrodes are disposed on the same plane, continuity between the terminal electrode and the connection electrode can be securely caused.

Further, the invention provides a method for connecting a light emitting display element to a wiring substrate, the light emitting display element being manufactured of an wafer semiconductor material, and being mounted on a wiring substrate so that a PN junction surface is made perpendicular to the wiring substrate, the light emitting display element comprising terminal electrodes formed at both ends in a perpendicular direction to the PN junction surface, the terminal electrodes being connected to connection electrodes provided on the wiring substrate at an interval, wherein a side surface of the light emitting display element between the terminal electrodes is opposed to the wiring substrate, and an electrically insulating coat is formed on the whole of at least the side surface, or a step is formed in the side surface opposite to the wiring substrate so that a side edge of the PN junction surface is recessed from side end surfaces of the terminal electrodes, the method comprising:

connecting the terminal electrode of the light emitting display substrate to the connection electrode of the wiring substrate by using an anisotropic electrically conductive resin adhesive.

In accordance with the invention, the anisotropic electrically conductive resin adhesive is applied on the connection electrode of the wiring substrate beforehand, and when the terminal electrode of the light emitting display element is connected thereon, heating and pressuring are performed. Since the anisotropic electrically conductive resin adhesive electrically conducts only between the side end surface of the terminal electrode of the light emitting display element and the connection electrode of the wiring substrate while the other portions are out of conduction, a secure connection is enabled with avoiding an electrical short in the PN junction surface.

In accordance with the present invention, since the anisotropic electrically conductive resin adhesive electrically conducts only between the side end surfaces of the terminal electrodes of the light emitting display element and the connection electrodes of the wiring substrate while the other portions are out of conduction, a secure electric connection is enabled with avoiding the electrical short in the PN junction surface.

Further, in the invention it is preferable that the terminal electrode of the light emitting display element is connected to the connection electrode of the wiring substrate by using an anisotropic electrically conductive resin adhesive including as an electrically conductive component only particles having a smaller maximum diameter than the step.

In accordance with the invention, even when the particles serving as the electrically conductive component of the anisotropic electrically conductive resin is held near the side edge of the PN junction surface, since the maximum diameter of the particles is smaller than the step, bridging in the PN junction surface will not occur, so that the terminal electrode and the connection electrode can be electrically connected to each other in a secure manner.

In accordance with the invention, even when the particles serving as the electrically conductive component of the anisotropic electrically conductive resin is held near the side edge of the PN junction surface, since the maximum diameter of the particles is smaller than the step, the bridging in the PN junction surface will not occur, so that the terminal electrode and the connection electrode can be electrically connected to each other in a secure manner.

Further, in the invention it is preferable that the terminal electrode of the light emitting display element is connected to the connection electrode of the wiring substrate by using an electrically conductive brazing material or an electrically conductive resin adhesive.

In accordance with the invention, the terminal electrode of the light emitting display element is, for example, temporarily bonded on the connection electrode of the wiring substrate, and is electrically connected by means of the electrically conductive brazing material or the electrically conductive resin adhesive. The electrically conductive brazing material or resin adhesive is relatively inexpensive in comparison with the anisotropic electrically conductive resin adhesive, so that a cost required for mounting the light emitting display element on the wiring substrate can be reduced.

In accordance with the invention, the connection electrode of the wiring substrate and the terminal electrode of the light emitting display element is electrically connected by means of the electrically conductive brazing material or the electrically conductive resin adhesive, so that a cost can be reduced in comparison with the case that the anisotropic electrically conductive resin adhesive is used.

Further, the invention provides a method for manufacturing a light emitting display element, the light emitting display element being mounted on a wiring substrate so that a PN junction surface is made perpendicular to the wiring substrate, and comprising terminal electrodes formed on both ends thereof in a perpendicular direction to the PN junction surface, the terminal electrodes being connected to connection electrodes provided on the wiring substrate at an interval, the method comprising;

a wafer manufacturing step of forming within a semiconductor wafer a PN junction surface which is parallel to surfaces of the semiconductor wafer, forming terminal electrodes corresponding to each of the light emitting display elements on one of the surfaces of the semiconductor wafer, and forming an electrode layer on the whole of the other of the surfaces;

an element separating step of attaching the other surface of the semiconductor wafer on an adhesion sheet, cutting the semiconductor wafer between the respective light emitting display elements to separate the semiconductor wafer into individual light emitting display element chips, and extending the adhesion sheet to enlarge a distance between the light emitting display element chips;

an insulating step of applying an electrically insulating resin to a gap between the light emitting display element chips from the one surface side and curing the electrically insulating resin;

an insulation removing step of removing the cured electrically insulating resin from the terminal electrode surfaces of the one surface side so as to expose the terminal electrode surfaces;

an electrode forming step of applying an electrically conductive paste from the one surface side, applying the electrically conductive paste to the other surface side after removing the adhesion sheet, and thermally curing the electrically conductive pastes applied to the both surfaces so as to form thick film electrodes; and separating into individual light emitting display element chips having electrically insulating resin layers on the whole of the side surfaces by cutting between the respective light emitting display element chips in such a manner that the cured electrically insulating resin is left on the chips.

In accordance with the invention, since the semiconductor wafer manufactured in the wafer manufacturing step is separated into each of the chips of the light emitting display element after being attached to the adhesion sheet in the element separating step, and after the adhesion sheet is extended so as to enlarge the distance between the light emitting display chips, the electrically insulating resin is applied and cured in the electrically insulating step, the electrically insulating coat can be formed in a state that a sufficient distance is kept between the light emitting display element chips. Since the distance between the chips is sufficient, a thick electrically insulating coat can be formed, so that at a time of cutting in the chip separating step, the electrically insulating coat can be left surrounding the light emitting display element chip.

In accordance with the invention, since the electrically insulating resin is applied and cured after the semiconductor wafer is separated into each of the chips of the light emitting display elements so as to enlarge the distance between the chips, after the cured electrically insulating resin is cut and separated, the cured electrically insulating resin can be sufficiently left in side surfaces of the light emitting display element.

Further, in the invention it is preferable that the electrically insulating resin applied at the insulating step is of an ultraviolet curable type.

In accordance with the invention, since the ultraviolet curable type resin is used for the electrically insulating resin, the ultraviolet ray is irradiated only to the portion to be cured and the non-cured portion can be easily removed.

In accordance with the invention, since the ultraviolet curable type resin is used for the electrically insulating resin, the ultraviolet ray is selectively irradiated so that the portion to be cured as the electrically insulating coat can be easily selected.

Further, in the invention in the insulating step, it is preferable that the electrically insulating resin is applied by a squeegee at the insulating step.

In accordance with the invention, since the electrically insulating resin is applied by using the squeegee, the application can be performed with a necessary thickness and in a uniform manner.

In accordance with the invention, since the squeegee is used at a time of applying the electrically insulating resin, the thickness to be applied can be securely controlled and the electrically insulating coat can be efficiently formed.

Further, in the invention it is preferable that the electrically conductive paste is applied by a squeegee at the electrode forming step.

In accordance with the invention, since the electrically conductive paste is applied by using the squeegee, the electrically conductive paste to be form the thick film electrodes can be uniformly applied to the semiconductor display element.

In accordance with the invention, since the squeegee is used at a time of applying the electrically conductive paste, the thickness of the thick film electrodes formed on both sides of the light emitting display element can be easily controlled.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1A:
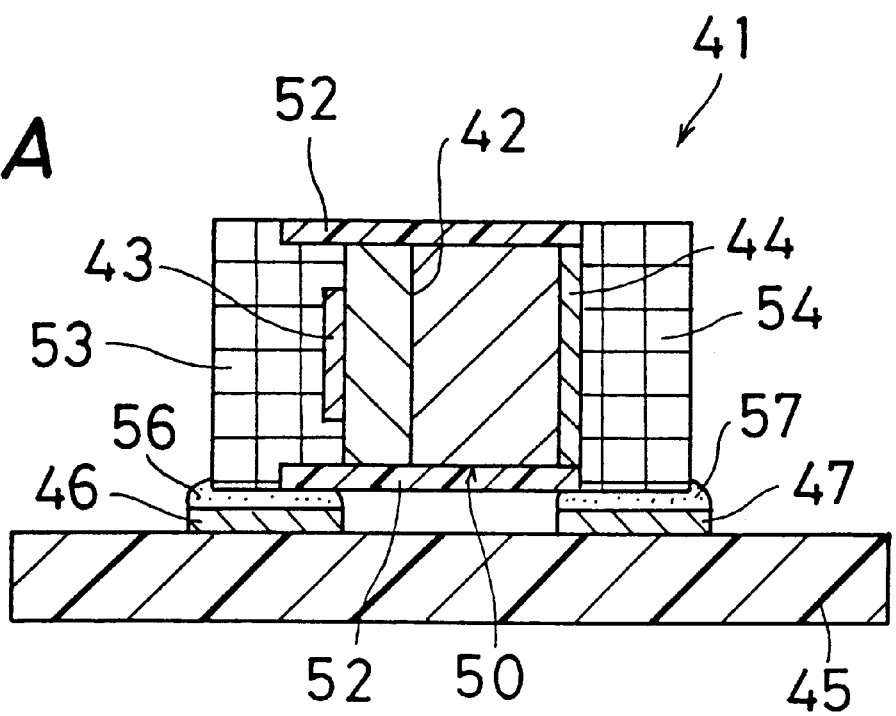
FIG. 1A is a cross sectional view which shows a mounted state of an LED chip 41 in accordance with an embodiment of the invention.

Now referring to the drawings, preferred embodiments of the invention are described below.

FIG. 1 shows a mounted state and an outer appearance of an LED chip 41 in accordance with an embodiment of the invention which is mounted on a substrate. FIG. 1A shows a mounted state in which the LED chip is mounted on the substrate in a horizontal state that a PN junction surface 42 is in perpendicular. Thin film electrodes 43, 44 are respectively formed on both sides in a perpendicular direction to the PN junction surface 42 of the LED chip 41 as a P pole and an N pole. The LED chip 41 is mounted on a unit substrate 45 in such a manner that the PN junction surface 42 is in perpendicular. Wiring patterns 46, 47 corresponding to connection electrodes for electric connection are formed on the unit substrate 45.

Figure 1B:
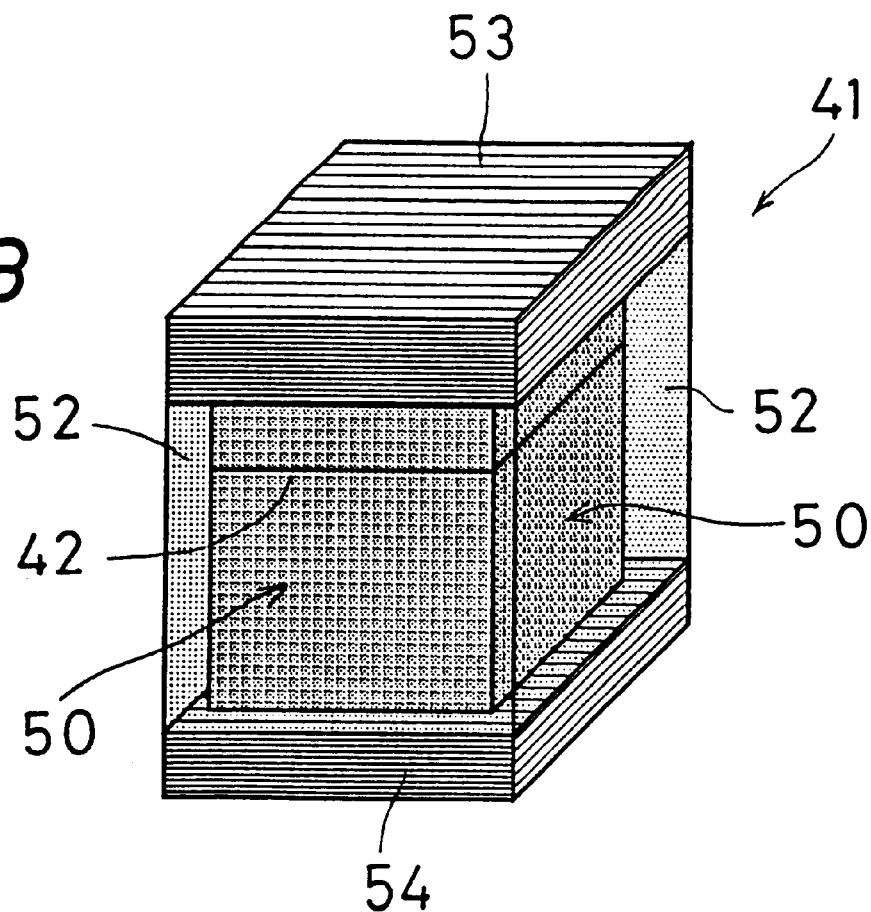
FIG. 1B is a perspective view which shows an outer appearance of the LED chip 41 in FIG. 1A.

A crystal surface 50 or a side surface of the LED chip 41 is covered with a colorless or colored transparent electrically insulating film 52 which is wholly formed. The electrically insulating film 52 is formed as an electrically insulating coat in such a manner as to long extend to the surface closer to the PN junction surface 42. The thin film electrode 43 is formed in such a manner as to be smaller than an end surface of the LED chip 41 in this surface end. The thin film electrode 44 on the other end surface is formed in such a manner as to cover all the end surface of the LED chip 41. Thick film electrodes 53, 54 are respectively formed on both sides of each of the thin film electrodes 43, 44 as terminal electrodes. The thick film electrodes 53, 54 are formed, for example, by thermally curing a silver (Ag) paste such as CT225K manufactured by TOSHIBA CHEMICAL KABUSHIKI KAISHA. FIG. 1B shows an outer appearance in a state of standing up the LED chip 41.

As shown in FIG. 1A, in the LED chip 41 in accordance with this embodiment, since the side surfaces of the LED chip 41 are wholly covered by the electrically insulating film 52 and the crystal surface 50 is not exposed, even when a mounting position at a time of mounting the LED chip 41 mounting to the unit substrate 45 is shifted, a trouble such as brightness reduction of the LED chip 41 and non-lighting is not generated as far as the electrical connection between the wiring patterns 46, 47 and the thick film electrodes 53, 54 is maintained by electrically conductive pastes 56, 57.

Figure 2:
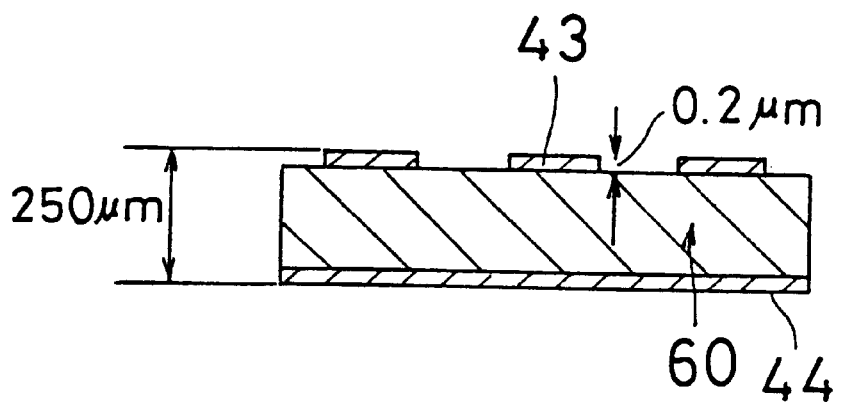
FIG. 2 is a simplified cross sectional view which shows a state of preparing an LED wafer 60 among steps of manufacturing the LED chip 41 in FIG. 1.

FIGS. 2 to 5, 6A, 6B, 7A, 7B, 8A, 8B, 8C, 9 and 10 show process steps of manufacturing the LED chip 41 shown in FIGS. 1A and 1B. At first, as shown in FIG. 2, for example, an LED wafer 60 having a thickness of 250 $\mu$m is prepared. Within the LED wafer, an N layer is epitaxially grown on an N type substrate and further a P layer is epitaxially grown on the N layer so as to form the PN junction surface. On one surface of the LED wafer, the thin film electrode 43 is independently formed for every light emitting display element, and the thin film electrode 44 is wholly formed on the other surface of the LED wafer. These thin film electrodes 43, 44 are formed of metal thin films such as gold (Au) and silver (Ag) having a thickness of about 0.29 $\mu$m.

In this case, as a material for the LED wafer 60, a semiconductor of III–V group compounds such as, for example, a gallium phosphorus (GaP) and a gallium arsenic (GaAs) is used. It is preferable that the semiconductor material forming the LED wafer 60 is selected from among the III–V group compound semiconductors, as well as from II–VI compound semiconductors or compound semiconductors of such as a silicon carbide (SiC). This is because many of these compound semiconductors emit light and can change the color of the emitting light by changing the material. It is preferable that the electrically insulating film 52 is made of the electrically insulating material selected among organic materials such as an epoxy resin, a phenol resin and an acrylic resin and an inorganic material such as silicon oxide ($SiO_2$) and an aluminum oxide ($Al_2O_3$) and also made of a transparent material with respect to the emitting light from the PN junction surface 42. This is because the use efficiency of the light will not be reduced.

Figure 3:
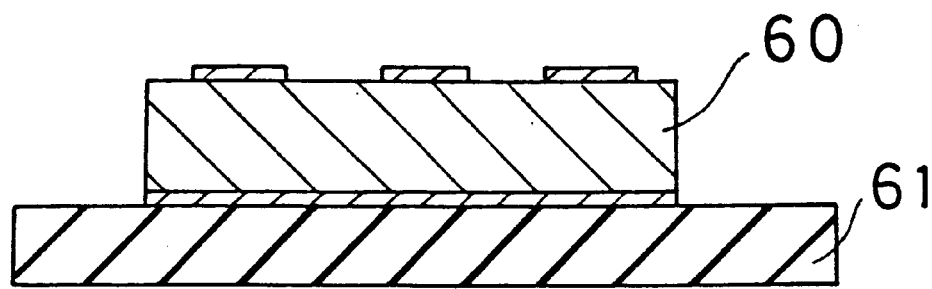
FIG. 3 is a cross sectional view which shows a state that attaching the LED wafer 60 in FIG. 2 is attached to an adhesion sheet 61.
Figure 4:
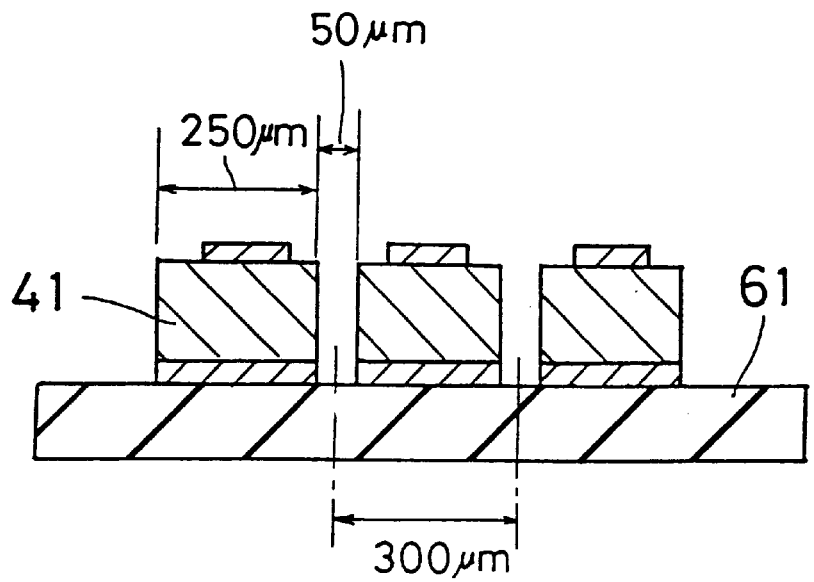
FIG. 4 is a cross sectional view which shows a state that the LED wafer 60 attached to the adhesion sheet 61 in FIG. 3 is fully diced.
Figure 5:
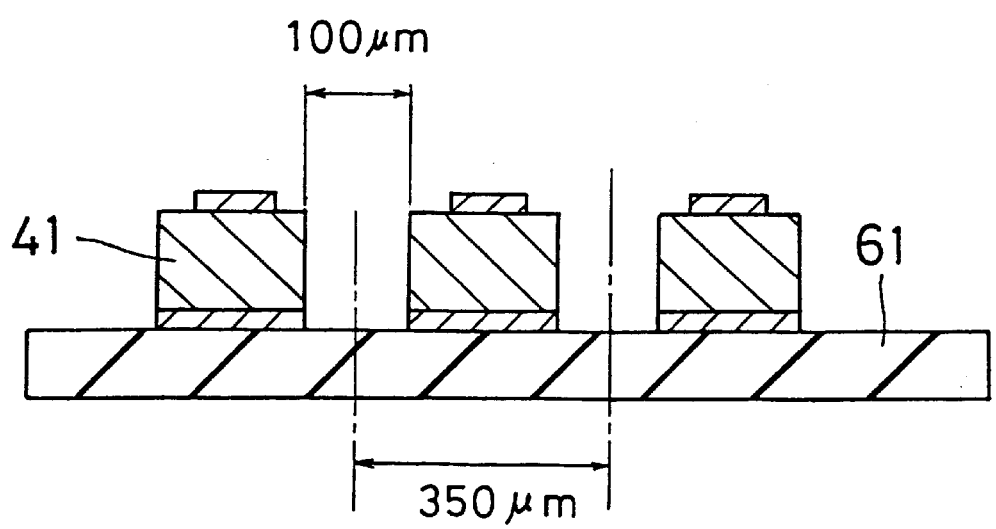
FIG. 5 is a cross sectional view which shows a state that a distance between the LED chips 41 is enlarged by extending the adhesion sheet 61 in FIG. 4.

Next, as shown in FIG. 3, the LED sheet 60 is attached to an adhesion sheet 61 on the other surface end. The adhesion sheet 61 is formed of a vinyl chloride film and the adhesion strength thereof is about 150 g/25 mm. Next, as shown in FIG. 4, the LED wafer 60 attached to the adhesion sheet 61 is fully dice-cut for every LED chip 41. The thickness of a blade of a dicing apparatus is about 40 $\mu$m and a dicing width becomes 50 $\mu$m due to the cutting shift. The dicing pitch is 300 $\mu$m and the width of the LED chip 41 after dicing becomes 250 $\mu$m. Next, as shown in FIG. 5, the adhesion sheet 61 is extended so as to enlarge the distance between the LED chips 41 to 100 $\mu$m.

Figure 6A:
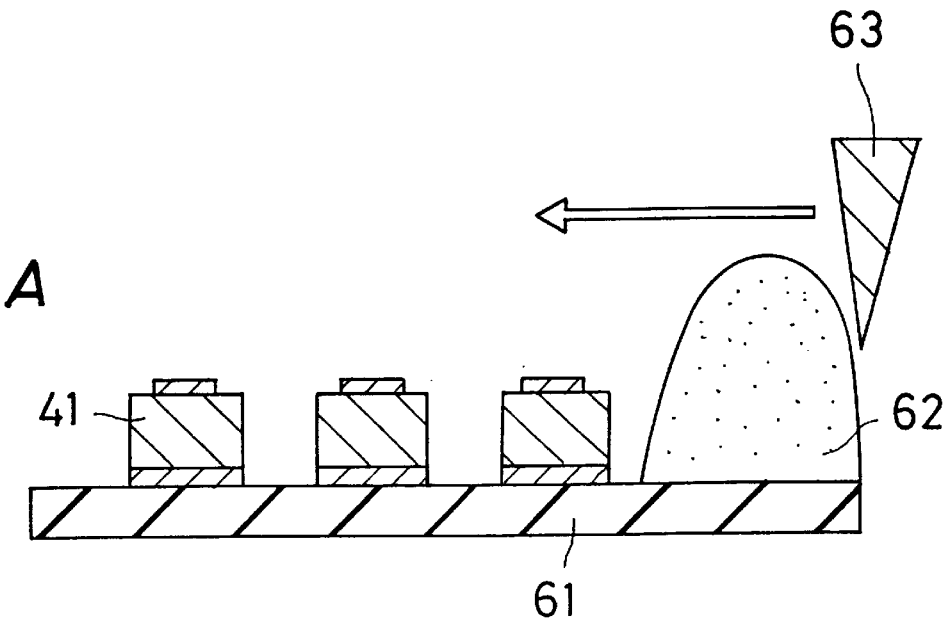
FIG. 6A is a simplified cross sectional view which shows a state immediately before applying an electrically insulating resin among a step of applying the electrically insulating resin.
Figure 6B:
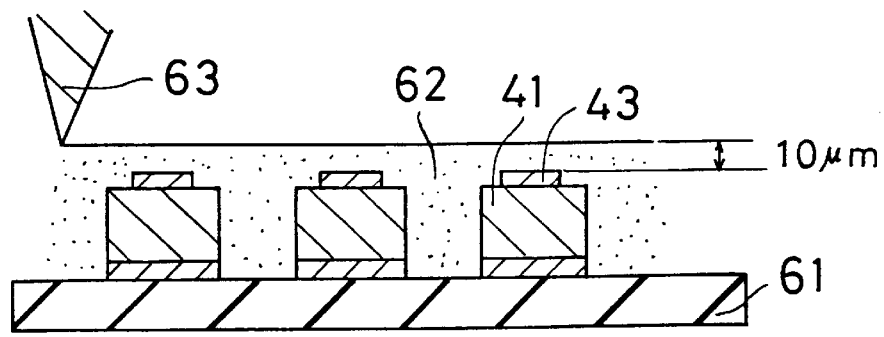
FIG. 6B is a simplified cross sectional view which shows a state of applying the electrically insulating resin among the step of applying the insulating resin.
Figure 7A:
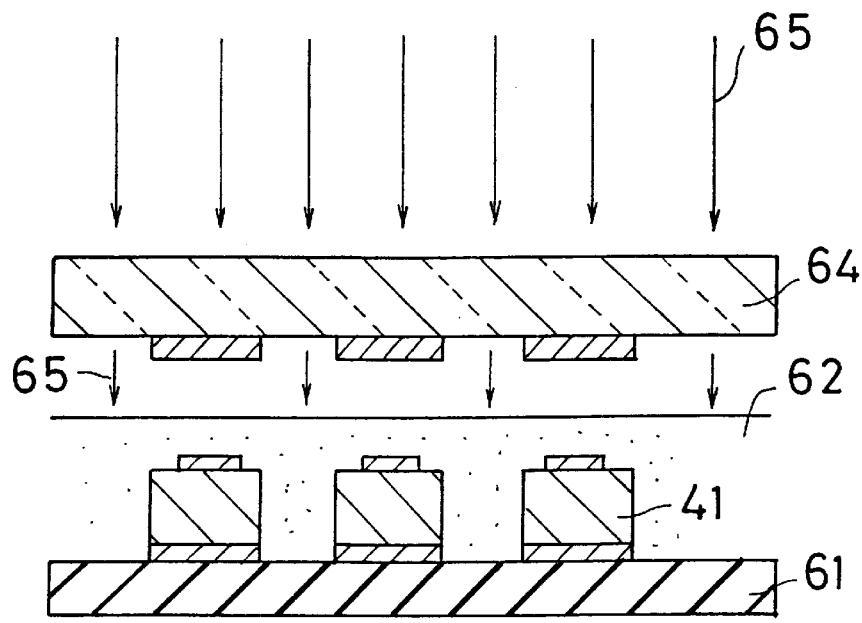
FIG. 7A is a simplified cross sectional view which shows a step of selectively exposing the insulating resin so as to cure the same.
Figure 7B:
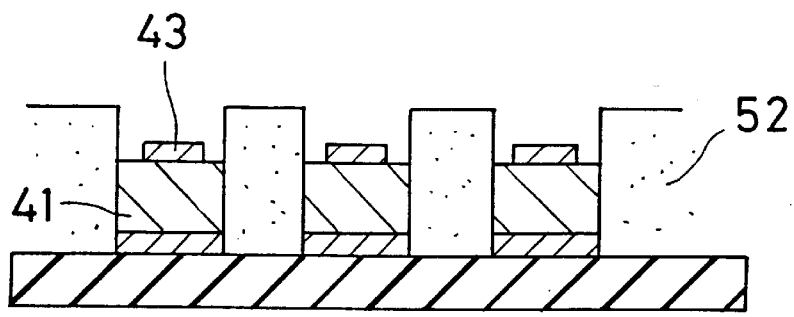
FIG. 7B is a simplified cross sectional view which shows a step of removing a non-cured portion after curing the electrically insulating resin.

FIGS. 6A, 6B and 6C show states that an ultraviolet curable type UV resin 62 is applied after the distance between the LED chips 41 is enlarged. In a state before application shown in FIG. 6A, the UV resin 62 is temporarily mounded on the adhesion sheet 61, a squeegee 63 of an applicator is moved in parallel to the surface of the adhesion sheet 61, and as shown in FIG. 6B, the application is performed in such a manner that the UV resin 62 covers about 10 $\mu$m from the surface of the thin film electrode 43 of the LED chip 41. As the UV resin, for example, a UV-80D manufactured by SUMITOMO KINZOKU KOZAN KABUSHIKI KAISHA is employed. FIGS. 7A and 7B show a state of selectively curing the applied UV resin 62 by an ultraviolet ray 65 by using a photo mask 64. The UV resin 62 is shielded by the photo mask 64 in such a manner as not to be cured on each of the LED chips 41 so that the UV resin 62 is cured only between the LED chips 41. When the ultraviolet ray 65 is exposed, the UV resin 62 of electrically insulating resin becomes solid at a portion where the ultraviolet ray 65 is irradiated and keeps a liquid state at a portion where the ultraviolet ray 65 is not irradiated.

FIG. 7B shows a state that the non-cured UV resin 62 is removed by an organic solvent, for example, an acetone, and the cured UV resin 62 is left as the electrically insulating film 52. In the portion where the non-cured UV resin 62 is washed out by the acetone and removed, the thin film electrode 43 is again exposed.

Figure 8A:
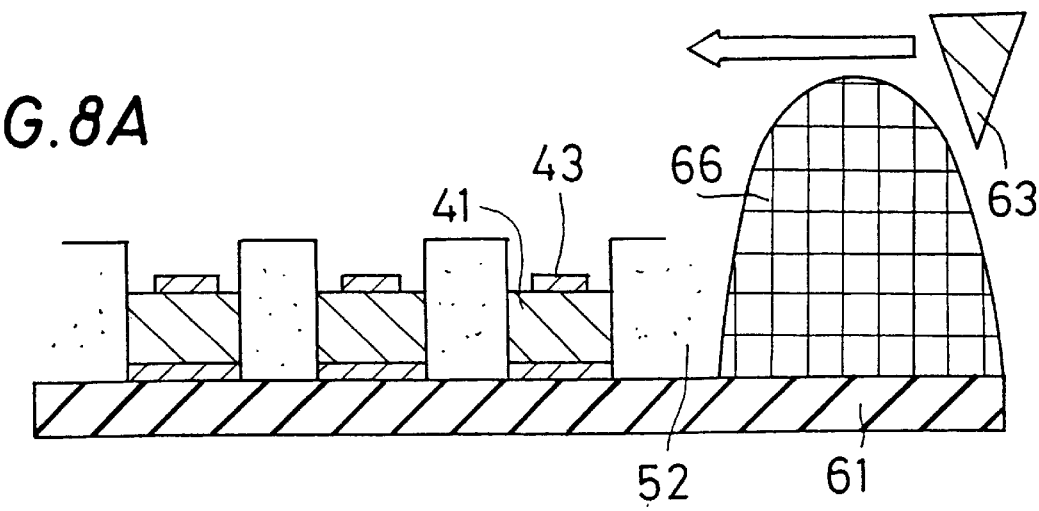
FIG. 8A is a simplified cross sectional view which shows a state immediately before applying an Ag paste among a step of applying the Ag paste.
Figure 8B:
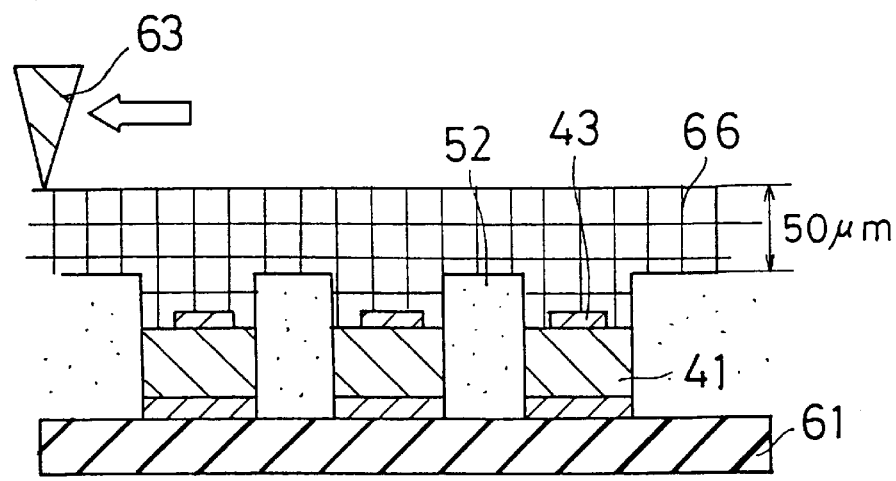
FIG. 8B is a simplified cross sectional view which shows a state of applying to one surface among the step of applying the Ag paste.
Figure 8C:
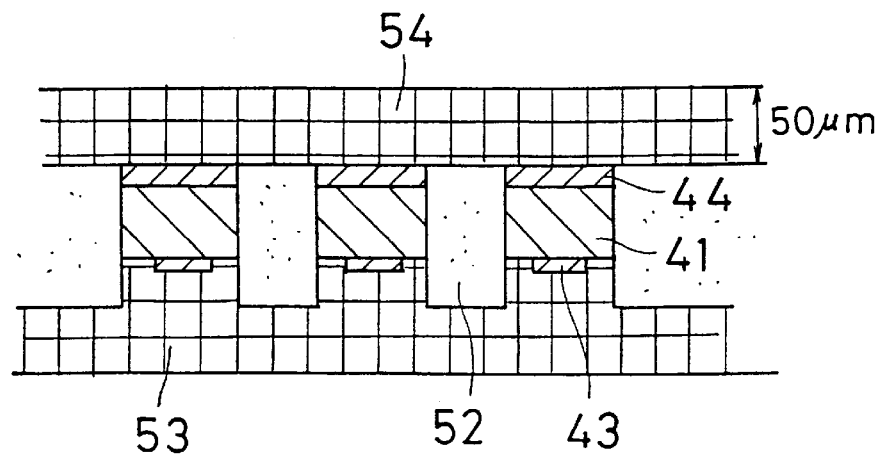
FIG. 8C is a simplified cross sectional view which shows a state of applying the other surface among the step of applying the Ag paste.

FIGS. 8A, 8B and 8C show a process of applying the Ag paste on the exposed thin film electrode 43. As shown in FIG. 8A, an Ag paste 66 is mounded on the adhesion sheet 61, the squeegee 63 of the applicator is moved in the parallel direction to the surface of the adhesion sheet 61, and as shown in FIG. 8B, the Ag paste 66 is applied at a thickness of about 50 $\mu$m. The Ag paste is also applied to the other surface end in which the adhesion sheet 61 is removed, as shown in FIG. 8C. The thickness of 50 $\mu$m at which the Ag paste 66 is applied can be controlled by adjusting a height of the squeegee 63 of the applicator. After applying the Ag paste 66 on both sides by heating for 2 hours at a temperature of 150° C., for example, the thick film electrodes 53, 54 can be obtained.

Figure 9:
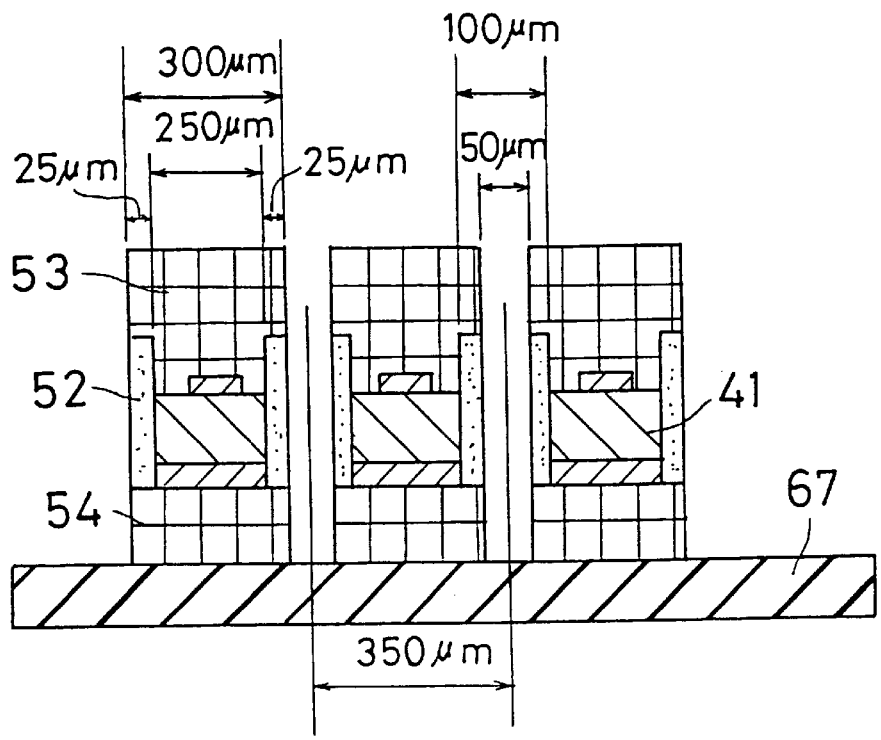
FIG. 9 is a simplified cross sectional view which shows a dicing step of finally separating the LED chip 41.

FIG. 9 shows a state that the electrically insulating film 52 and the thick film electrodes 53, 54 between each of the LED chips 41 are fully dice-cut by the dicing apparatus. Before fully dice-cut by the dicing apparatus, an adhesion sheet 67 is again attached to the other surface end. When the LED chip 41 is fully dice-cut at a dicing width of 50 $\mu$m by the dicing apparatus, the LED chip 41 is completed in a state that the electrically insulating film 52 having a thickness of 25 $\mu$m is formed on each of the LED chips 41. As a result of the above dicing, the chip size becomes 0.30 mm×0.30 mm.

Figure 10:
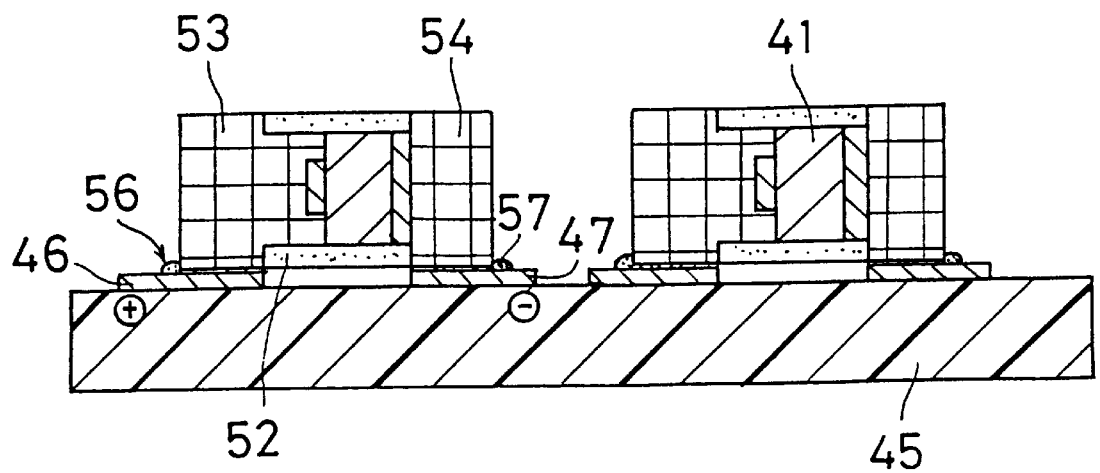
FIG. 10 is a simplified cross sectional view which shows a state of mounting the LED chip 41 having been subjected to the dicing, on a unit substrate 45 in a horizontal state.

FIG. 10 shows a state that the LED chip 41 completed in FIG. 9 is implemented to the unit substrate 45 for mounting the chip. The electrically conductive pastes 56, 57 of thermal curing type are attached to the wiring patterns 46, 47, and the LED chip 41 is mounted on the electrically conductive pastes 56, 57. After mounting the chip, the LED chip 41 is fixed on the unit substrate 45 by thermally curing the electrically conductive pastes 56, 57 which are the electrically conductive resin adhesive.

Figure 23:
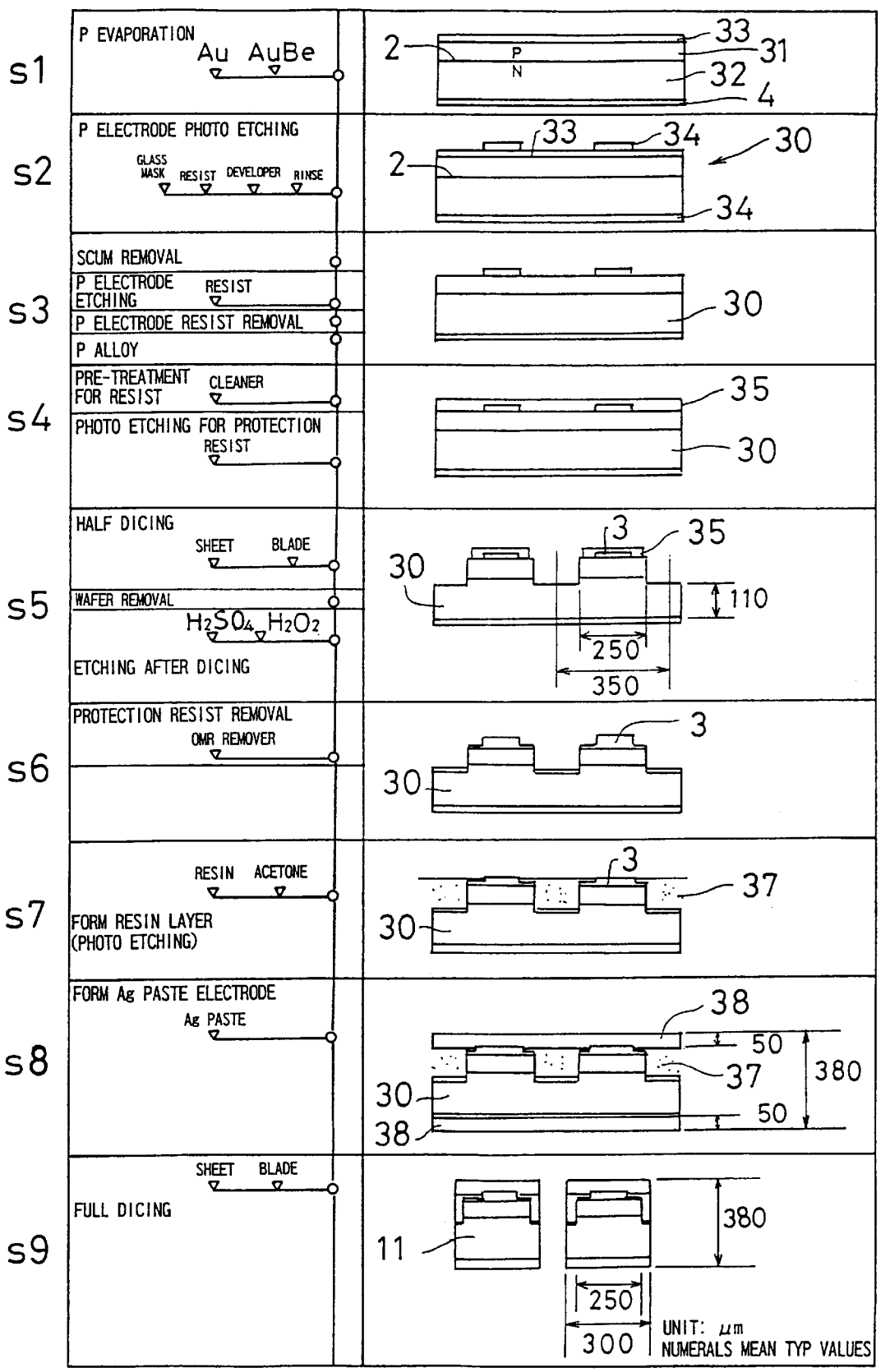
FIG. 23 is a flow chart which shows steps of manufacturing the LED chip 11 in FIG. 21.

In accordance with the embodiment, since the UV resin 62 is applied to the gap between the LED chips 41 as shown in FIGS. 6A, 6B, 7A and 7B after fully dice-cut as shown in FIG. 4, the whole of a side surface of the LED chip 41 can be covered with the electrically insulating film 52. In the manufacturing method of the conventional LED chip shown in FIG. 23, since the electrically insulating film is formed as shown in step s7 after the half dicing is performed as shown in step s5, the electrically insulating film 12 can not be formed on the whole of the side surface of the LED chip 11. This is because the LED chip 11 comes apart when the full dicing is performed in step s5. In this embodiment, as shown in FIG. 3, since the adhesion sheet 61 is previously attached to the LED wafer 60, the full dicing of the LED wafer 60 can be performed in FIG. 4.

Further, in this embodiment, as shown in FIG. 5, after fully dicing, an enlargement for enlarging the distance between the enlarged chips is performed. In the full dicing shown in FIG. 9, although the width required between the adjacent LED chips 41 is 100 μm, in the dicing in FIG. 4, the distance is 50 μm. By performing the enlargement in FIG. 5, the distance between the LED chips 41 is widened to a range between 50 μm and 100 μm. Conversely speaking, in the manufacturing process in accordance with this embodiment, since this enlargement can be performed, as is understood by comparing FIG. 4 with FIG. 6A, the width of the dicing can be made narrow, so that the LED wafer 60 can be efficiently used. When the mounting direction of the LED chip 41 can be distinguished, the electrically insulating film 52 may be formed only on the side surface which is in contact with the unit substrate 45; or after forming on all of the surface of the electrically insulating film 52, may be removed for other portions than the portion contacting with the unit.

Figure 11A:
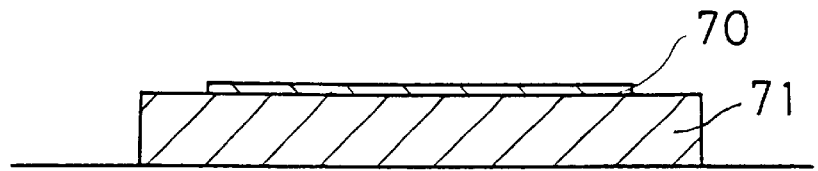
FIG. 11A is a cross sectional view which shows a state in which a work is set in the applying step of the electrically insulating resin as shown in FIGS. 6A and 6B.
Figure 11B:
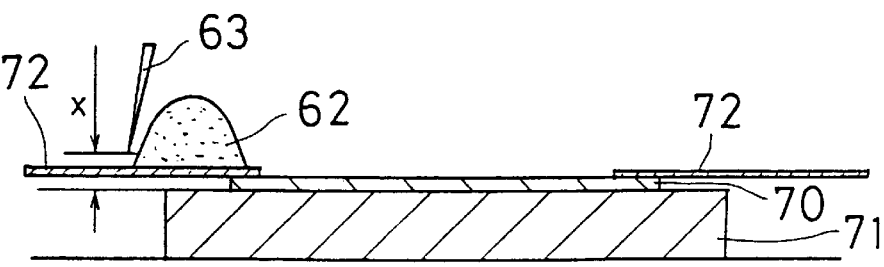
FIG. 11B is a cross sectional view which shows a state in which a mask is set on the work in the applying step of the electrically insulating resin as shown in FIGS. 6A and 6B.
Figure 11C:
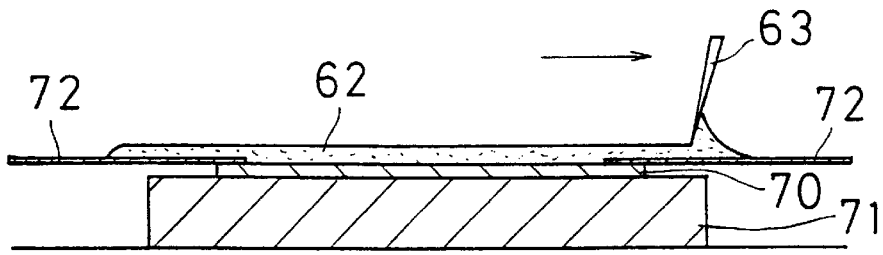
FIG. 11C is a cross sectional view which shows a state in which a UV resin on the mask is applied in the applying step of the electrically insulating resin as shown in FIGS. 6A and 6B.
Figure 11D:
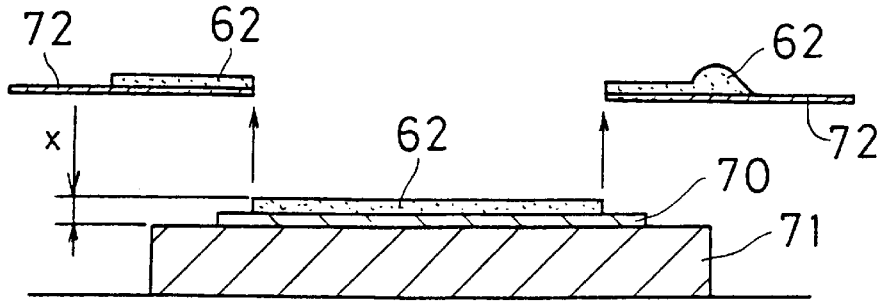
FIG. 11D is a cross sectional view which shows a state in which the mask is removed in the applying step of the electrically insulating resin as shown in FIGS. 6A and 6B.

FIGS. 11A, 11B, 11C and 11D show the application process of the electrically insulating resin shown in FIGS. 6A and 6B further in detail. As shown in FIG. 11A, a work 70 in a state shown in FIG. 6A is set on a base 71 of the applicator. Next, as shown in FIG. 11B, a mask 72 having an opening portion a little smaller than the surface of the work 70 is set on the work 70 and the UV resin 62 is mounded on the mask 72. The height of the blade edge of the squeegee 63 is adjusted to be a height x from the surface of the base 71 and the squeegee 63 is moved in parallel to the surface of the base 71 as shown in FIG. 1C. Accordingly, the UV resin 62 can be applied on the work 70 at a uniform thickness. As shown in FIG. 1D, when the mask 72 is removed from the surface of the work 70, the UV resin 62 can be applied on the surface of the work 70 at a height of x from the surface of the base 71. The application of the Ag paste 66 shown in FIGS. 8A, 8B and 8C can be performed in the same manner.

Figure 12:
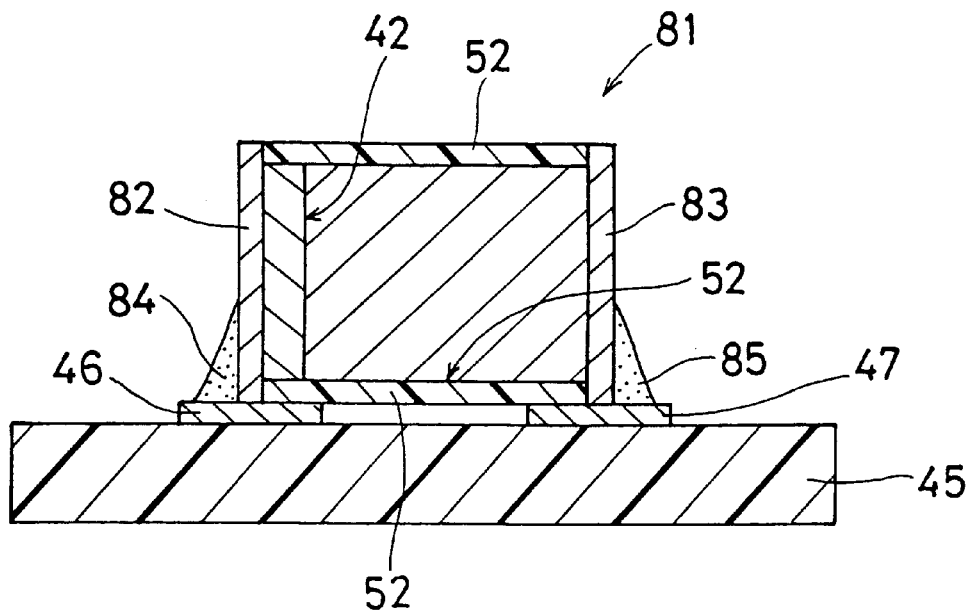
FIG. 12 is a cross sectional view which shows a mounted state of an LED 81 in accordance with another embodiment of the invention.

FIG. 12 shows a state that electrical connections of the wiring pattern 46, 47 are performed with respect to the terminal electrodes 82, 83 on the both sides in a perpendicular direction to the PN junction surface 42 by using electrically conductive brazing materials 84, 85, such as a solder or the like, as an LED chip 81 in accordance with another embodiment of the invention. Even in the case of connecting by the solder, as far as the electrically insulating film 52 is formed, the trouble such as a electrical short can be prevented. The electrically conductive brazing materials 84, 85, and the electrically conductive resin adhesive such as the electrically conductive pastes 56, 57 shown in FIGS. 1A and 1B are inexpensive in comparison with anisotropic electrically conductive resin adhesives mentioned later, so that the LED chips 41, 81 can be mechanically mounted on and electrically connected to the unit substrate 45 with low cost.

Figure 13:
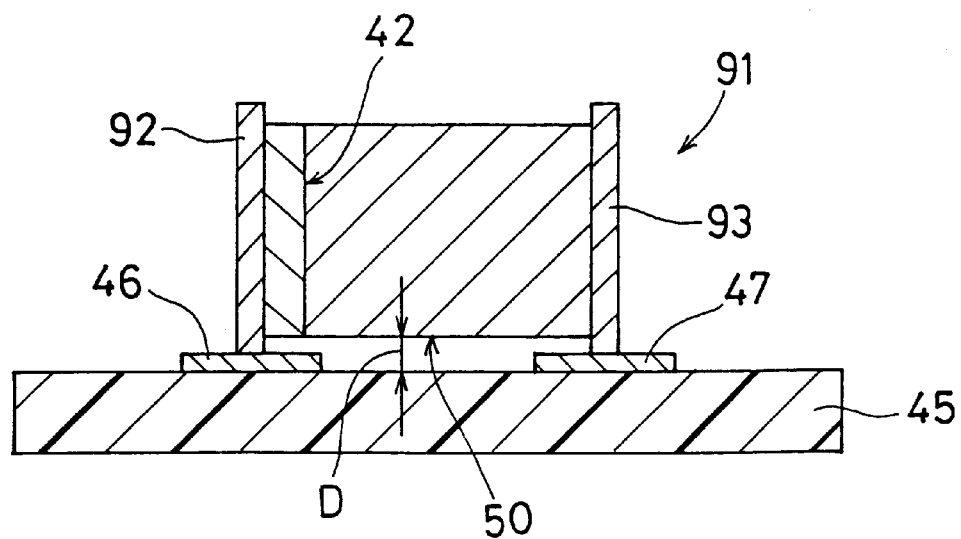
FIG. 13 is a cross sectional view which shows a mounted state of an LED 91 in accordance with still another embodiment of the invention.

FIG. 13 shows a state that terminal electrodes 92, 93 of an LED chip 91 are formed to be larger than a cross section of the LED chip 91 itself, so that a step generating a space having a distance D between the surface of the unit substrate 45 and the PN junction surface 42 is provided at a time of being mounted on the unit substrate 45, as a still another embodiment of the invention. In a state of being mounted on the unit substrate 45, the lower end of the PN junction surface 42 is disposed at a higher position than the lower ends of the terminal electrodes 92, 93. When such a space is present between the side edge of the PN junction surface 42 and the unit substrate 45, that is, between the crystal surface 50 and the unit substrate 45, the PN junction surfaces 42 is never in contact with such as the wiring pattern on the unit substrate 45 to cause a short circuit, so that a good electrically insulating condition can be maintained.

Figure 14:
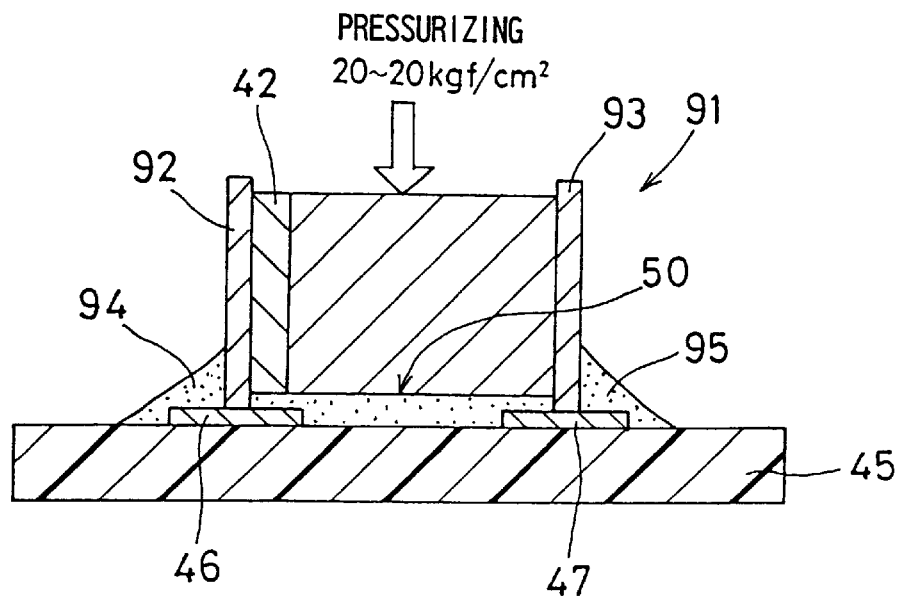
FIG. 14 is a cross sectional view which shows a state of connecting the LED chip 91 in FIG. 13 by using anisotropic electrically conductive resin adhesives 94, 95.

FIG. 14 shows a state that the LED chip 91 shown in FIG. 13 is electrically connected to the wiring patterns 46, 47 by anisotropic electrically conductive resin adhesives 94, 95. The non-cured anisotropic electrically conductive resin adhesives 94, 95 are applied on the wiring patterns 46, 47 of the unit substrate 45, and after the LED chip 91 is mounted the non-cured anisotropic electrically conductive resin adhesives 94, 95 are pressed and heated. The pressure of the pressing is made, for example, 2 to 20 kgf/cm$^2$. As the anisotropic electrically conductive resin adhesives 94, 95, for example, "MORFIT TG-9000R (trade name)" manufactured by HIGHSOL COMPANY or the corresponding products can be used. The anisotropic electrically conductive resin adhesives 94, 95 are composed of a light transmitting liquid epoxy resin supplied with some tens wt % electrically conductive coarse particles are combined with. The diameter of the electrically conductive coarse particle is equal to or less than about 10 μm.

Figure 15:
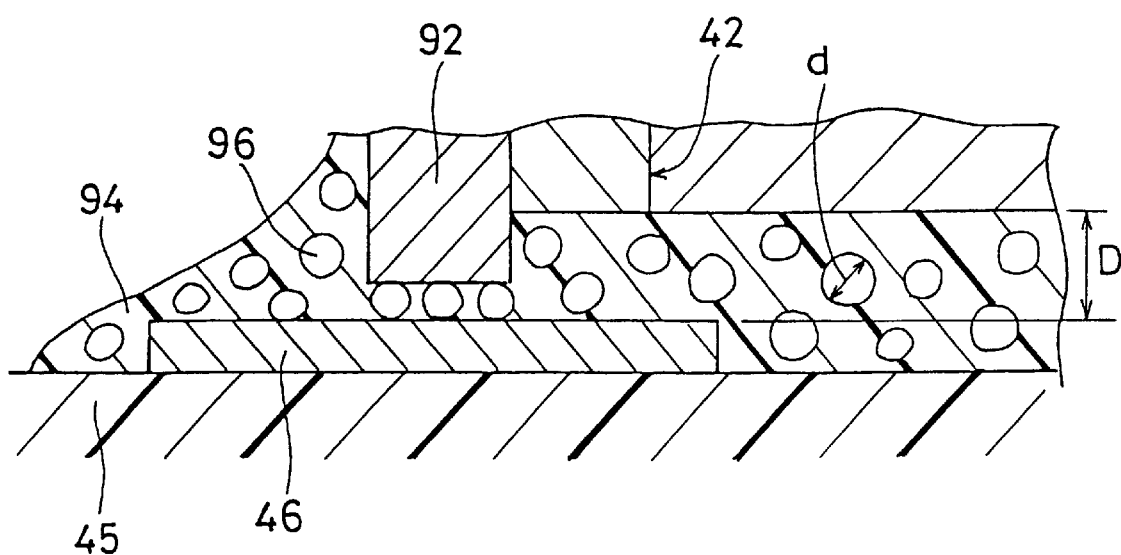
FIG. 15 is a schematic cross sectional view which shows a state near a gap between a terminal electrode 92 and the wiring pattern 46.

FIG. 15 schematically shows an inner portion of the anisotropic electrically conductive resin adhesive 94 near the gap between the terminal electrode 92 and the wiring pattern 46, as an effect of the pressing in FIG. 14. A particle of an electrically conductive material such as a metal included in the anisotropic electrically conductive resin adhesive 94 as an electrically conductive component exists in a dispersed state when the pressure is not applied. Since the resin itself is electrically insulating, the resin does not have an electrically conductive characteristic when the particles 97 are dispersed. The pressed portion is going to have an electrically conductive characteristic as the particles 96 themselves, and the particle 96 and the side end surface of the terminal electrode 92 or the wiring pattern 46 are in contact with each other. Since the pressing force is applied only to the portion between the side end surface of the terminal electrode 92 and the surface of the wiring pattern 46, the anisotropic electrically conductive resin adhesive 94 in the other portions maintains an electrically insulating characteristic. The same applies to the other terminal electrode 93 and the wiring pattern 47 end. When the resin is cured by heating, the LED chip 91 is fixed to the unit substrate 45 so that a secure mounting can be performed.

In this case, it is preferable that the diameter d of the particle 96 is set to be smaller than the distance D between the crystal surface 50 of the LED chip 91 and the surface of the unit substrate 45. With doing this, even when the particle 96 enters into the portion near the PN junction surface 42, there is no risk of electrically bridging the PN junction surface 42, so that the electrically insulating characteristic of the PN junction surface 42 can be well maintained. Further, in the embodiments shown in FIGS. 12 to 15, when the terminal electrodes 82, 83; 92, 93 are either the thick film electrodes 53, 54 shown in FIGS. 1A and 1B, or the thin film electrodes 43, 44 shown in FIG. 2, the connection can be performed in the same manner.

Figure 16:
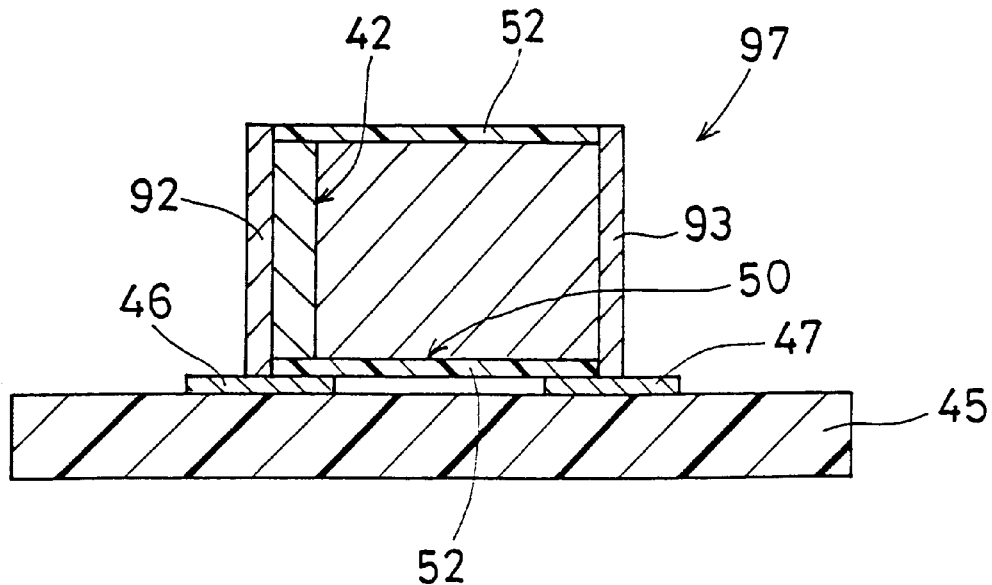
FIG. 16 is a cross sectional view which shows a schematic structure of an LED chip 96 in accordance with yet still another embodiment of the invention.

FIG. 16 is an LED chip 97 in accordance with yet still another embodiment of the invention. The LED chip 97 is formed by covering the surface of the crystal surface 50 of the LED chip 91 in accordance with the embodiment of FIGS. 13 to 15. Accordingly, the electrically insulating characteristic of the PN junction surface 42 can be further securely maintained. Since the surface of the electrically insulating film 52 is formed in such a manner as to be the same surface as the side end surfaces of the terminal electrodes 92, 93, at least the electrically insulating coat forming the electrically insulating film 52 does not protrude to the side end surfaces of the terminal electrodes 92, 93, so that the wiring patterns 46, 47, and the terminal electrodes 92, 93 are directly in contact with each other when the LED chip 97 is mounted on the unit substrate 45.

Figure 17:
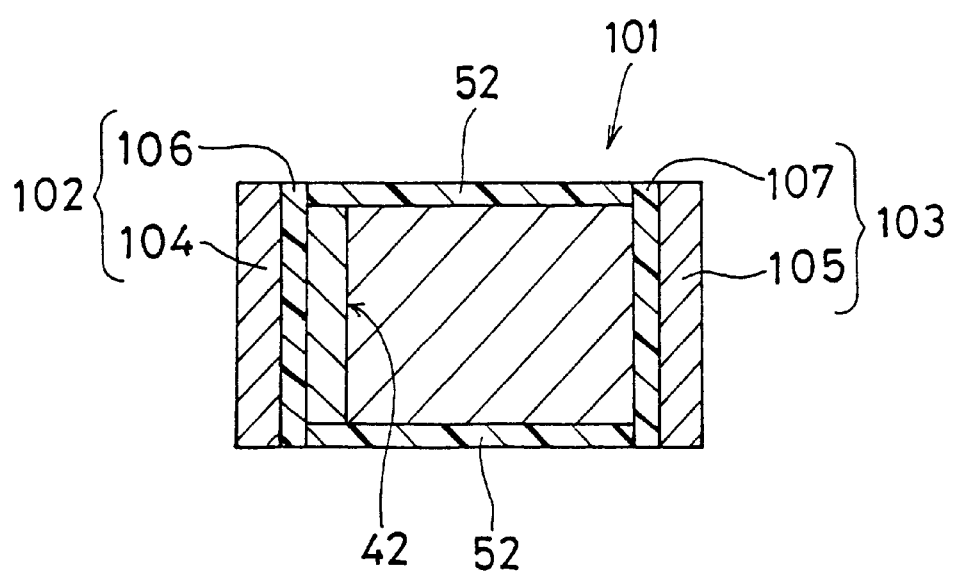
FIG. 17 is a cross sectional view which shows a schematic structure of an LED chip 101 in accordance with a further embodiment of the invention.

FIG. 17 shows a state that terminal electrodes 102, 103 are formed by metal thin films 104, 105 and an electrically conductive brazing materials or electrically conductive resin adhesives 106, 107, as an LED chip 101 in accordance with a further embodiment of the invention. The connection between the metal thin film electrodes 43, 44 formed in wafer forms, and the metal thin films 104, 105 are enabled by the electrically conductive brazing materials or the electrically conductive resin adhesives 106, 107 with a lower cost than the case that the anisotropic electrically conductive resin adhesive used.

Figure 18:
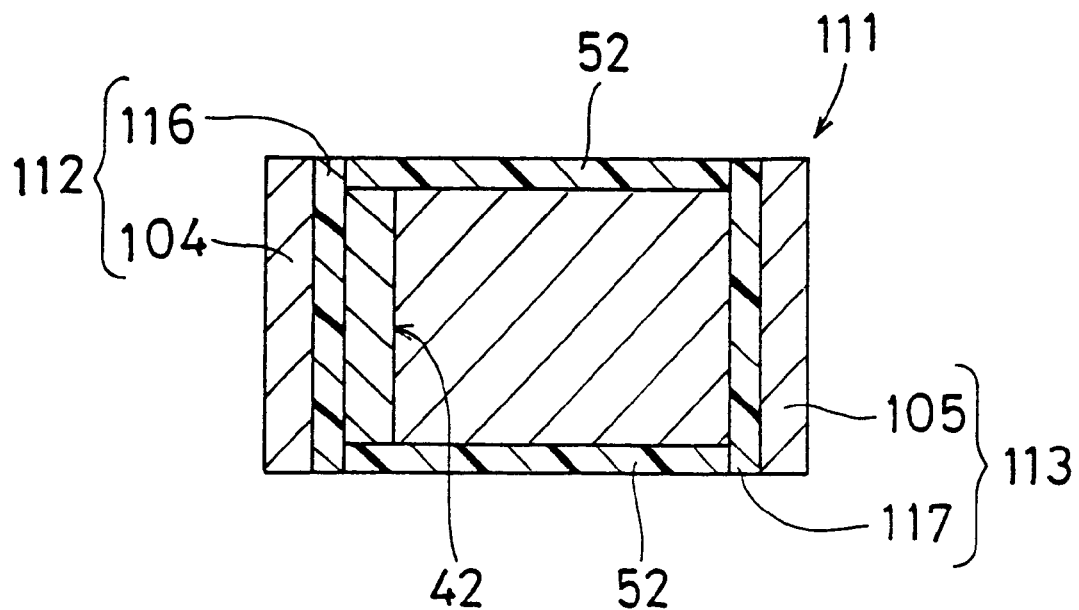
FIG. 18 is a cross sectional view which shows a schematic structure of an LED chip 111 in accordance with a still further embodiment of the invention.

FIG. 18 shows a state that terminal electrodes 112, 113 are formed by the metal thin films 104, 105, and anisotropic electrically conductive resin adhesives 116, 117, as an LED chip 111 in accordance with still further embodiment of the invention. The connections between the metal thin film electrodes 43, 44 formed in wafer forms, and the metal thin film 104, 105 can be securely executed by using the anisotropic electrically conductive resin adhesives 116, 117.

Figure 19:
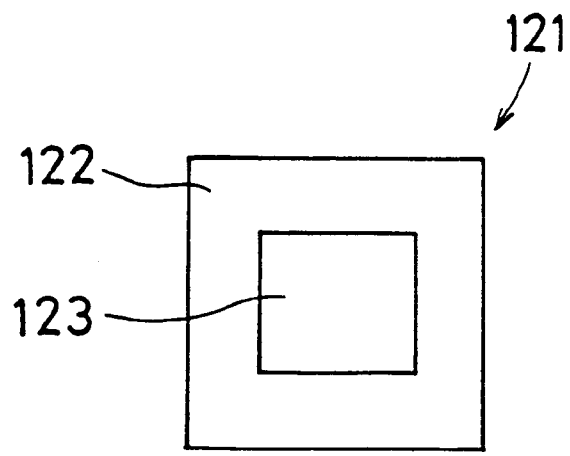
FIG. 19 is a cross sectional view which shows a schematic structure of an LED chip 121 in accordance with a yet still further embodiment of the invention.
Figure 20A:
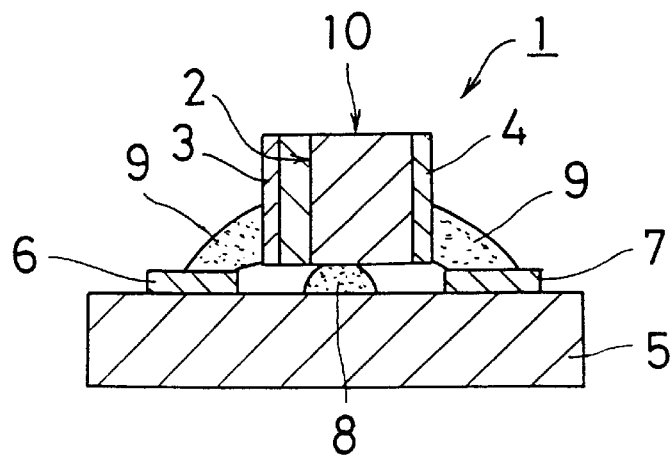
FIG. 20A is a cross sectional view which shows a mounted state of a conventional LED chip 1.
Figure 20B:
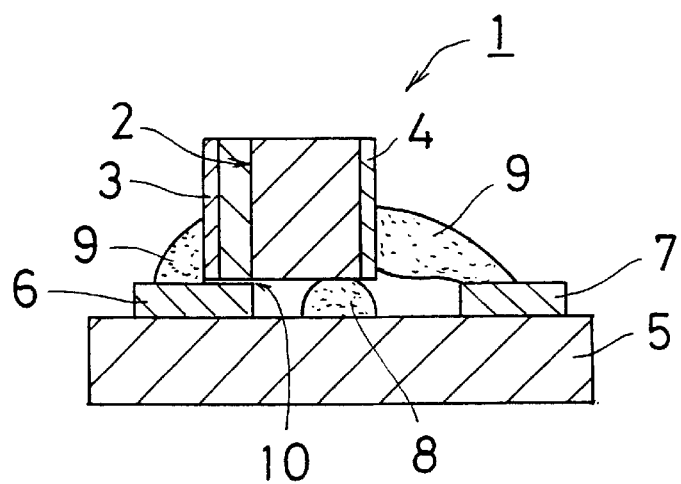
FIG. 20B is a cross sectional view which shows a mounted state of the conventional LED chip 1 and the case that amounting accuracy is bad.
Figure 20C:
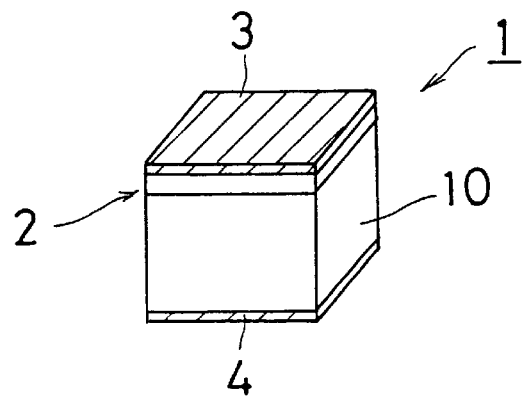
FIG. 20C is a perspective view which shows an outer appearance of the conventional LED chip 1.
Figure 21A:
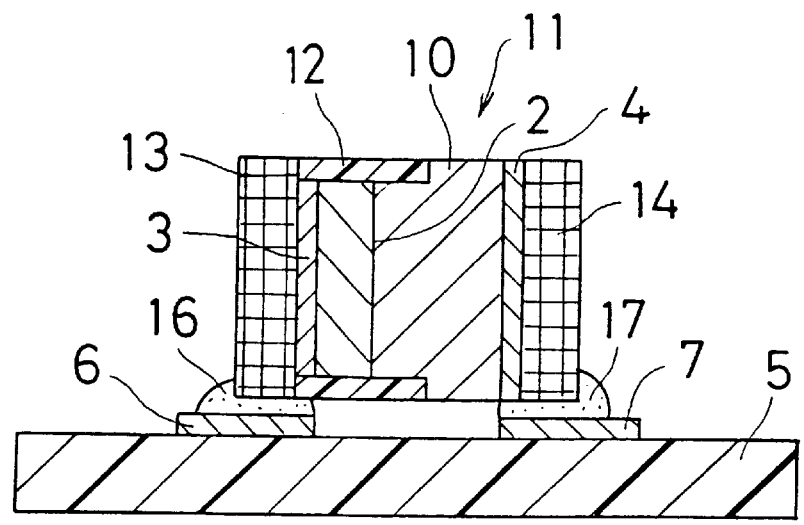
FIG. 21A is a cross sectional view which shows a mounted state in which an electrically insulating film is formed in a part of the side surface of a conventional LED chip 11.
Figure 21B:
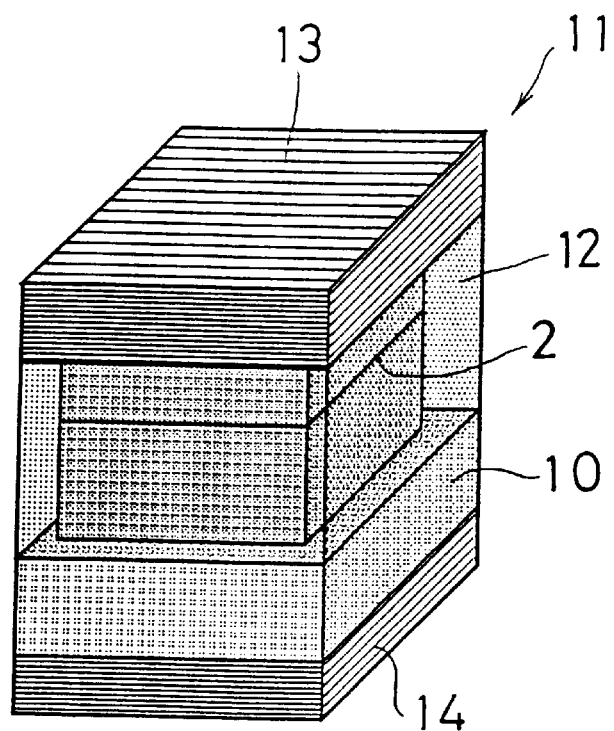
FIG. 21B is a cross sectional view which shows an outer appearance of the conventional LED chip 11 in the case that the electrically insulating film is formed in a part of the side surface.
Figure 22A:
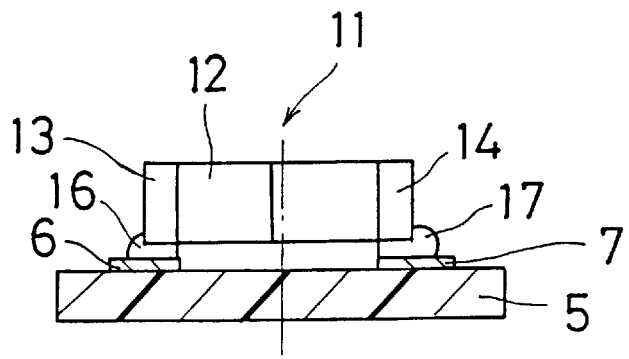
FIG. 22A is a cross sectional view which shows an mounting state of the LED chip 11 in FIG. 21.
Figure 22B:
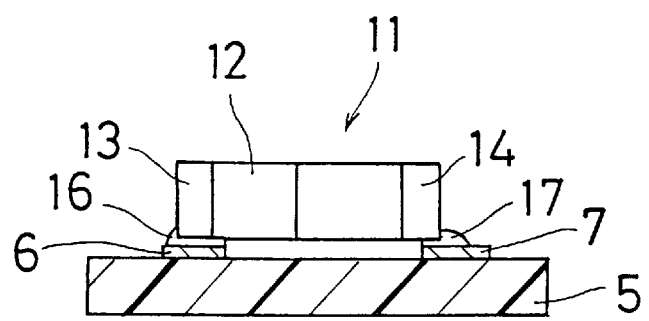
FIG. 22B is a cross sectional view which shows a influence due to a position shift at a time of mounting the LED chip 11 in FIG. 21.
Figure 22C:
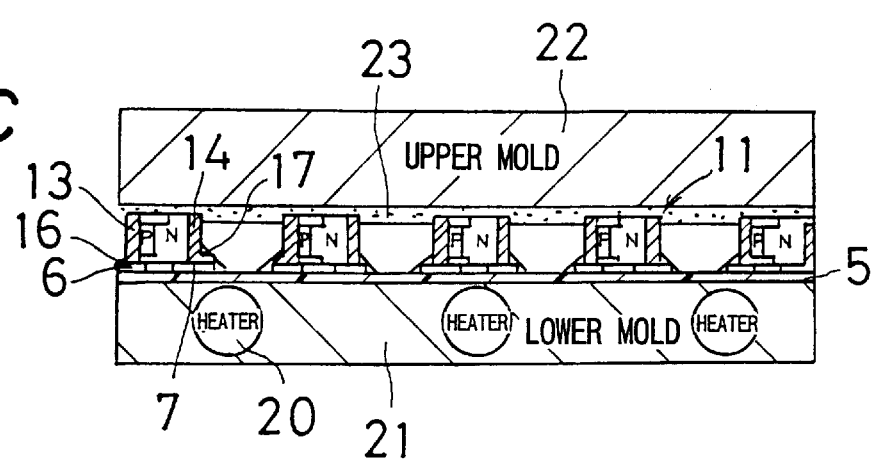
FIG. 22C is a simplified cross sectional view which shows a mounting process of a plurality of LED chips 11 by crimping and heating.

FIG. 19 shows a state that at least one terminal electrode 122 is formed with leaving a light transmitting space 123, as an LED chip 121 in accordance with yet still further embodiment of the invention. In this embodiment, the terminal electrode 122 is not formed on the whole surface of the crystal parallel to the PN junction surface, but partly formed. The portion in which the terminal electrode 122 is not formed becomes the light transmitting space 123, and the semiconductor crystal is exposed. The intensity of light output from the LED chip 121 is increased by using the light emitting from the light transmitting space 123. Various kinds of shapes can be used for the shape of the light transmitting space 123, for example, in the same manner as that disclosed in the prior art Japanese Unexamined Patent Publication JP-A 54-22186 (1979).

In each of the embodiments, it is preferable that the surfaces of the thick film electrodes 53, 54 and the terminal electrodes 82, 83; 92, 93; 102, 103; 112, 113; 122 are mounted in such a manner as to be in a perpendicular direction to the surface of the wiring substrate. This is because the side end surfaces of the thick film electrodes 53, 54 and the terminal electrodes 82, 83; 92, 93; 102, 103; 112, 113; 122 are formed by dicing in perpendicular to the surface, so that are in parallel to the wiring pattern such as the wiring patterns 46, 47. In the case where the side end surface and the pattern are not in parallel to each other, they can not be in a surface contact but in a line contact, so that the contact area is reduced. The larger the contact area is, the better the conduction is secured, so that the electric resistance can be reduced.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A light emitting display element comprising a semiconductor material, and mounted on a wiring substrate so that a PN junction surface is perpendicular to the wiring substrate, the light emitting display element further comprising terminal electrodes formed on each of the two ends thereof which are parallel to the PN junction surface, the terminal electrodes being connected to connection electrodes provided on the wiring substrate, wherein a side surface of the light emitting display element is opposed to the wiring substrate, and an electrically insulating coat is formed to cover part, but not all, of the side surface of the light emitting display element, the part of the side surface which is covered including the entire portion of the side surface between the terminal electrodes, wherein the electrically insulating coat is formed of an ultraviolet curable resin.

2. A light emitting display element comprising a semiconductor material, and mounted on a wiring substrate so that a PN junction surface is perpendicular to the wiring substrate, the light emitting display element further comprising terminal electrodes formed on each of the two ends thereof which are parallel to the PN junction surface, the terminal electrodes being connected to connection electrodes provided on the wiring substrate, wherein a side surface of the light emitting display element is opposed to the wiring substrate, and an electrically insulating coat is formed to cover part, but not all, of the side surface of the light emitting display element, the part of the side surface which is covered including the entire portion of the side surface between the terminal electrodes, wherein the electrically insulating coat is transparent to light outgoing from the PN junction surface and is made of a material selected from among organic materials including epoxy resins and phenol resins.

3. The light emitting display element of claim 1, wherein the semiconductor material is a material selected from among III–V group compound semiconductors, II–VI group compound semiconductors or a silicon carbide.

4. The light emitting display element of claim 3, wherein the terminal electrodes are formed of a combination of a metal thin film, and an electrically conductive brazing material or an electrically conductive resin adhesive.

5. The light emitting display element of claim 3, wherein the terminal electrodes are formed of a combination of a metal thin film and an anisotropic electrically conductive resin adhesive.

6. The light emitting element of claim 2, wherein the terminal electrodes are formed in such a manner that surfaces of the terminal electrodes which are parallel to the PN junction are perpendicular to the surface of the wiring substrate.

7. The light emitting display element of claim 3, wherein the terminal electrodes are formed so as to leave light transmitting space on at least part of the respective ends of the light emitting display element.

8. The light emitting display element of claim 3, wherein a step is so formed in the side surface opposite to the wiring substrate that a side edge of the PN junction surface is recessed from side end surfaces of the terminal electrodes.

9. The light emitting display element of claim 8, wherein the electrically insulating coat is so formed on the side surface on which the step is formed, that a surface of the electrically insulating coat is disposed on the same plane as the side end surfaces of the terminal electrodes formed at both the ends.

10. A light emitting device comprising:
a display element comprising a semiconductor element having a PN junction, electrodes formed on both faces of said semiconductor element parallel to said PN junction and an insulating film formed on a least one of the side surfaces of said display element so as to cover the side surface of said semiconductor element and to leave at least a portion of the side surface of each of said electrodes uncovered; and
an insulating substrate having a wiring layer formed on a surface thereof,
wherein said display element is arranged on the surface of said insulating substrate so that the PN junction of said semiconductor element is perpendicular to the surface of said insulation substrate and the uncovered portions of said electrodes face respective portions of said wiring level, and
wherein said insulating film comprises an ultraviolet curable resin.

11. A light emitting device comprising:
a display element comprising a semiconductor element having a PN junction, electrodes formed on both faces of said semiconductor element parallel to said PN junction and an insulating film formed on a least one of the side surfaces of said display element so as to cover the side surface of said semiconductor element and to leave at least a portion of the side surface of each of said electrodes uncovered; and
an insulating substrate having a wiring layer formed on a surface thereof,
wherein said display element is arranged on the surface of said insulating substrate so that the PN junction of said semiconductor element is perpendicular to the surface of said insulating substrate and the uncovered portions of said electrodes face respective portions of said wiring level, and
wherein said insulating film is an organic material.

12. The light emitting device of claim 11, wherein each of said electrodes comprises a thin film electrode film and a thick film electrode film.

13. The light emitting device of claim 11, wherein said semiconductor element comprises a group III–V compound, a group II–VI compound or silicon carbide.

14. The light emitting device of claim 11, wherein an electrically conductive adhesive electrically connects the uncovered portions of said electrodes to said wiring layer.

15. The light emitting device of claim 11, wherein said electrodes are electrically connected to said wiring layer via an electrically conductive brazing material.

16. The light emitting device of claim 11, wherein said insulating film is formed on both side surfaces of said display element.

17. The light emitting device of claim 11, wherein at least one of said electrodes has a light transmitting opening formed therein.

* * * * *